United States Patent
Cui et al.

(10) Patent No.: US 11,499,228 B2
(45) Date of Patent: Nov. 15, 2022

(54) STITCHING TWO-DIMENSIONAL ATOMIC CRYSTALS BY ATOMIC LAYER DEPOSITION AS STABLE INTERFACES FOR BATTERIES

(71) Applicant: The Board of Trustees of the Leland Stanford Junior University, Stanford, CA (US)

(72) Inventors: Yi Cui, Stanford, CA (US); Jin Xie, Stanford, CA (US); Lei Liao, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 254 days.

(21) Appl. No.: 16/618,771

(22) PCT Filed: Jun. 19, 2018

(86) PCT No.: PCT/US2018/038343
§ 371 (c)(1),
(2) Date: Dec. 2, 2019

(87) PCT Pub. No.: WO2018/236912
PCT Pub. Date: Dec. 27, 2018

(65) Prior Publication Data
US 2020/0131638 A1    Apr. 30, 2020

Related U.S. Application Data

(60) Provisional application No. 62/524,197, filed on Jun. 23, 2017.

(51) Int. Cl.
*C23C 16/455* (2006.01)
*H01M 4/04* (2006.01)
(Continued)

(52) U.S. Cl.
CPC ..... *C23C 16/45555* (2013.01); *H01M 4/0428* (2013.01); *H01M 4/667* (2013.01); *H01M 4/668* (2013.01); *H01M 10/052* (2013.01)

(58) Field of Classification Search
CPC ....... H01M 4/0428; H01M 4/667–668; H01M 10/052; C23C 16/45555
See application file for complete search history.

(56) References Cited

U.S. PATENT DOCUMENTS

| | | | |
|---|---|---|---|
| 2011/0111300 A1* | 5/2011 | DelHagen | H01M 4/134 429/223 |
| 2015/0180023 A1* | 6/2015 | Xiao | H01M 4/625 429/231.8 |
| 2015/0364747 A1* | 12/2015 | Elam | H01M 10/0562 204/192.1 |

FOREIGN PATENT DOCUMENTS

CN    106803580 A  *  6/2017  ........  H01M 10/0525

OTHER PUBLICATIONS

Zhang, Q., Pan, J., Lu, P., Liu, Z., Verbrugge, M. W., Sheldon, B. W., . . . & Xiao, X. (2016). Synergetic effects of inorganic components in solid electrolyte interphase on high cycle efficiency of lithium ion batteries. Nano letters, 16(3), 2011-2016.) (Year: 2014).*

(Continued)

*Primary Examiner* — William E McClain
*Assistant Examiner* — Jason Barton
(74) *Attorney, Agent, or Firm* — Foley & Lardner LLP

(57) ABSTRACT

An anode includes: (1) a current collector; and (2) an interfacial layer disposed over the current collector. The interfacial layer includes a film of a layered material and a reinforcing material selectively disposed over certain regions of the film, while other regions of the film remain exposed from the reinforcing material.

15 Claims, 29 Drawing Sheets

(51) Int. Cl.
  *H01M 4/66*    (2006.01)
  *H01M 10/052*  (2010.01)

(56) References Cited

OTHER PUBLICATIONS

Fan, Lei, et al. "Regulating Li deposition at artificial solid electrolyte interphases." Journal of Materials Chemistry A 5.7 (2017): 3483-3492. (Year: 2017).*
Machine translation of CN106803580A (Year: 2017).*
International Preliminary Report on Patentability issued in PCT Application No. PCT/US2018/038343 dated Jan. 2, 2020, 7 pages.
Deng, Jingwen et al., "Interconnected MnO2 nanoflakes assembled on graphene foam as a binder-free and long-cycle life lithium battery anode", Carbon, 2015, vol. 92, pp. 177-184.
Feng, Bingmei et al., "Free-standing hybrid film of less defective graphene coated with mesoporous TiO2 for flexible lithium ion batteries with fast charging/discharging capabilities", 2016, 2D Materials, vol. 4, No. 1, Article No. 015011, pp. 1-9.
International Search Report and Written Opinion issued in PCT Application No. PCT/US2018/038343 dated Mar. 11, 2019, 11 pages.
Teng, Yongqiang et al., "MoS2 nanosheets vertically grown on graphene sheets for lithium-ion anodes", ACS Nano, 2016, vol. 10, No. 9, pp. 8526-8535.
Xie et al., "Stitching h-BN by atomic layer deposition of LiF as a stable interface for lithium metal anode", Science Advances, Nov. 29, 2017, 3: eaao3170, 26 pages.
Yan, Kai et al., "Ultrathin two-dimensional atomic crystals as stable interfacial layer for improvement of lithium metal anode", Nano Letters, 2014, vol. 14, No. 10, pp. 6016-6022.

\* cited by examiner

STITCHING TWO-DIMENSIONAL ATOMIC CRYSTALS BY ATOMIC LAYER DEPOSITION AS STABLE INTERFACES FOR BATTERIES

CROSS-REFERENCE TO RELATED APPLICATION

This application is a National Stage Entry of PCT/US2018/038343, filed Jun. 19, 2018, which claims the benefit of and priority to U.S. Provisional Application No. 62/524,197, filed Jun. 23, 2017, the contents of which are incorporated herein by reference in their entirety.

STATEMENT REGARDING FEDERALLY SPONSORED RESEARCH OR DEVELOPMENT

This invention was made with Government support under contract DE-AC02-76SF00515 awarded by the Department of Energy. The Government has certain rights in the invention.

BACKGROUND

With the highest specific capacity of about 3860 mAh/g, lithium (Li) metal has long been considered the most promising candidate anode material to implement lithium-sulfur (Li—S) and lithium-air (Li—$O_2$) battery technology, which can in turn provide about 5-10 times increased overall energy density as compared to Li-ion battery technology. However, the commercial application of Li metal anodes has been constrained by two fundamental challenges. First, Li metal is strongly reducing and tends to react with battery electrolytes to form a solid electrolyte interphase (SEI). The reaction at the electrode/electrolyte interface consumes both active Li and electrolyte. Second, due to the virtually infinite relative volume change in Li metal anodes, the naturally formed SEI layer is weak against mechanical deformation, and it undergoes continuous formation and breakdown upon battery cycling. Together, the chemical and mechanical instabilities cause dendritic Li plating/stripping with low Coulombic efficiencies, which can constrain the cycle life of batteries and lead to shorting and potentially severe safety events. The high-surface area Li also enhances the kinetics of thermal reactions, effectively lowering the temperature at which thermal runaway can occur. Therefore, engineering a stable interface is an important task to achieve a stable and safe Li metal anode.

It is against this background that a need arose to develop embodiments of this disclosure.

SUMMARY

In some embodiments, an anode includes: (1) a current collector; and (2) an interfacial layer disposed over the current collector. The interfacial layer includes a film of a layered material and a reinforcing material selectively disposed over certain regions of the film, while other regions of the film remain exposed from the reinforcing material.

In some embodiments, a battery includes: (1) the anode of the foregoing embodiments; (2) a cathode; and (3) an electrolyte disposed between the anode and the cathode.

In some embodiments, a method of forming an anode for a battery includes: (1) providing a current collector and a film of a layered material disposed over the current collector; and (2) performing atomic layer deposition to deposit a reinforcing material selectively on certain regions of the film, while other regions of the film remain exposed from the reinforcing material.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DESCRIPTION

Figure 12:
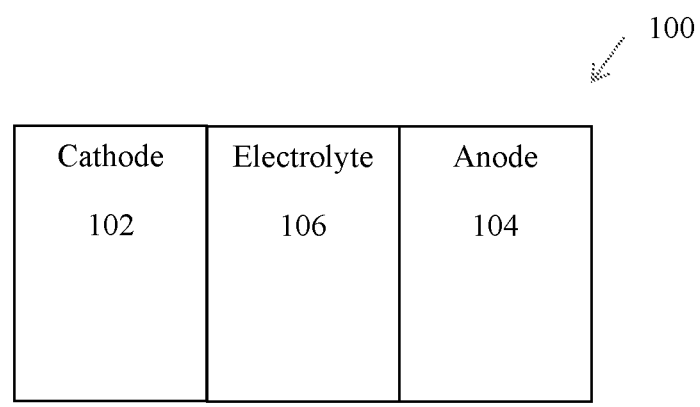
FIG. 12. Schematic of a Li battery according to some embodiments.

FIG. 12 shows a schematic of a Li battery 100 according to some embodiments. The Li battery 100 includes a cathode 102, an anode 104, and an electrolyte 106 disposed between and in contact with the cathode 102 and the anode 104. In some embodiments, the Li battery 100 is a lithium-sulfur battery in which the cathode 102 includes sulfur, and, in some embodiments, the Li battery 100 is a lithium-air battery in which the cathode 102 is a gas cathode. Other types of Li batteries are encompassed by this disclosure.

Figure 13:
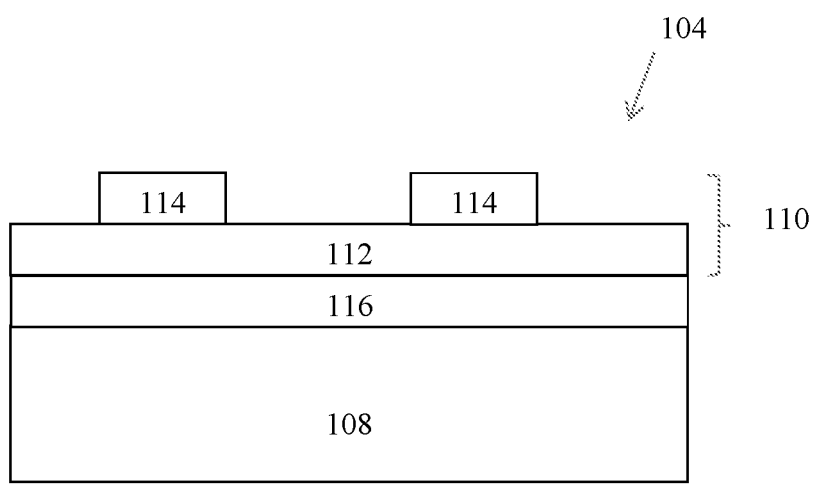
FIG. 13. Schematic of an anode according to some embodiments.

In some embodiments of the Li battery 100, the anode 104 is a lithium metal anode, and includes a current collector 108 and an interfacial layer 110 disposed over and covering at least a portion of a major surface (e.g., a top surface) of the current collector 108, as shown in a schematic of FIG. 13. An anode material 116, which corresponds to lithium metal in some embodiments, is disposed between the current collector 108 and the interfacial layer 110, and is deposited on the current collector 108 during cycling. The current collector 108 can be formed of, or can include, a metal (e.g., copper), a metal alloy (e.g., stainless steel), or other suitable electronically conductive material.

In some embodiments of the Li battery 100, the interfacial layer 110 is formed as a flexible film having a largely flat or planar configuration. The interfacial layer 110 separates or isolates lithium metal deposition and dissolution beneath the interfacial layer 110 from formation of a stable, conformal SEI above the interfacial layer 110. The interfacial layer 110 is loosely or weakly bound to the current collector 108 and can move up and down to adjust the availability of spaces during cycling. A top surface of the interfacial layer 110 is relatively static and allows the formation of the stable, conformal SEI, while lithium metal deposition takes place underneath, on the current collector 108.

In some embodiments of the Li battery 100, the interfacial layer 110 is formed as a hybrid or a composite of a film 112 of a 2D material having defect sites, and a coating 114 of a stitching or reinforcing material selectively or preferentially disposed over certain regions of the 2D material corresponding to the defect sites, while other regions of the 2D material remain exposed from the stitching material. As shown in FIG. 13, the coating 114 of the stitching material is in the form of a non-continuous, conformal film, such as having gaps or openings exposing the underlying film 112 of the 2D material, or in the form of discrete coating regions that are spaced apart from one another to expose the underlying film 112. For example, the coating 114 can provide a surface coverage of the film 112 in a range of less than 100% and, more particularly, can provide a surface coverage of the film 112 of up to about 60%, such as about 55% or less, about 50% or less, about 45% or less, about 40% or less, about 35% or less, about 30% or less, about 25% or less, or about 20% or less, and down to about 15% or less, or down to about 10% or less. Surface coverage can be assessed using imaging techniques, such as using transmission electron microscopy (TEM) or scanning electron microscopy (SEM), Rutherford backscattering spectroscopy, X-ray photoelectron spectroscopy (XPS), atomic force microscopy (AFM), or inductively coupled plasma mass spectrometry (ICP-MS).

The presence of the stitching material selectively on defects sites is beneficial in improving overall physical and chemical stability of the hybrid film. Examples of suitable 2D materials include hexagonal boron nitride (h-BN), graphene, layered transition metal oxides and chalcogenides (e.g., $MoS_2$), and other layered materials. A combination of different 2D materials is also contemplated. Suitable 2D materials can be single layered, or can include two or more stacked layers. In some embodiments, the film 112 of the 2D material is polycrystalline including crystalline domains or grains, and having defect sites corresponding to point defects (e.g., pinholes within one or more crystalline domains or grains) and line defects (e.g., boundaries between crystalline domains or grains). In some embodiments, the stitching material is selectively or preferentially disposed over regions of the 2D material corresponding to the defect sites, and can be in the form of nanostructures having at least one dimension in a range of about 1 nm to about 1000 nm, about 1 nm to about 500 nm, about 1 nm to about 300 nm, or about 1 nm to about 100 nm, such as nanoparticles having aspect ratios of about 3 or less, and nanowires having aspect ratios of greater than about 3. Examples of suitable stitching materials include compounds including at least one metal and at least one non-metal, such as metal halides (e.g., metal fluorides including alkali metal fluorides like lithium fluoride (LiF) and post-transition metal fluorides like aluminum fluoride ($AlF_3$)), metal oxides (e.g., alkali metal oxides like lithium oxide ($Li_2O$) and post-transition metal oxides like aluminum oxide ($Al_2O_3$)), and metal nitrides (e.g., alkali metal nitrides like lithium nitride ($Li_3N$)). Mixed metal compounds including two or more different metals and at least one non-metal and mixed non-metal compounds including at least one metal and two or more different non-metals (e.g., lithium phosphorus oxynitride (LiPON)) are also encompassed by this disclosure. Other embodiments of the interfacial layer 110 having three-dimensional (3D) configurations are contemplated. For instance, instead of a planar configuration, 2D materials can be formed into 3D materials having 3D morphologies to attain enhanced specific areas for high current applications, and a stitching material can be disposed between boundaries of constituents of a 3D material and on defect sites within the constituents of the 3D material.

Other types of batteries are encompassed by this disclosure. For instance, some embodiments are directed to a sodium (Na) battery, which includes a cathode, an anode, and an electrolyte disposed between and in contact with the cathode and the anode. In some embodiments of the Na battery, the anode is a sodium metal anode, and includes a current collector and an interfacial layer disposed over and covering at least a portion of a major surface (e.g., a top surface) of the current collector. An anode material, which corresponds to sodium metal in some embodiments, is disposed between the current collector and the interfacial layer, and is deposited on the current collector during cycling.

Other embodiments are directed to a method of forming an electrode for a battery, such as an anode. In some embodiments, the method includes providing a current collector and a film of a 2D material disposed over and covering at least a portion of a major surface (e.g., a top surface) of the current collector. The film of the 2D material has defect sites. The method also includes performing atomic layer deposition to deposit a stitching or reinforcing material selectively or preferentially on certain regions of the 2D material corresponding to the defect sites, while other regions of the 2D material remain exposed from the stitching material.

In some embodiments of the method, providing the current collector and the film of the 2D material includes growing or forming the film of the 2D material, such as via chemical vapor deposition, on a substrate, and transferring the film of the 2D material from the substrate to the current collector.

In some embodiments of the method, the stitching material includes a compound including at least one metal and at least one non-metal, and performing atomic layer deposition includes sequentially performing a first atomic layer deposition cycle to introduce deposition gases including a chemical precursor or reactant including the metal, followed by performing a second atomic layer deposition cycle to introduce deposition gases including a chemical precursor or reactant including the non-metal. The first deposition cycle and the second deposition cycle can be repeated sequentially to deposit a desired amount of the stitching material. It is noted that the first deposition cycle can be repeated multiple times before the second deposition cycle, and that the second deposition cycle can be repeated multiple times before the first deposition cycle. It is also noted that either deposition cycle can be performed first.

Other embodiments are directed to a method of forming a metal layer. In some embodiments, the method includes providing a substrate and a hybrid film of a 2D material and a stitching material disposed over and covering at least a portion of a major surface (e.g., a top surface) of the substrate. The method also includes electrochemically depositing a metal (e.g., lithium, sodium, zinc, copper, or another metal) underneath the hybrid film to the form the metal layer between the hybrid film and the substrate.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Overview:

Defects are features in two-dimensional (2D) materials that can have a strong influence on their chemical and physical properties. With enhanced chemical reactivity at defect sites (e.g., point defects, line defects, and so forth), 2D materials can be selectively functionalized via chemical reactions to tune their properties. In this example, the selective atomic layer deposition of lithium fluoride (LiF) is performed on defect sites of hexagonal boron nitride (h-BN) prepared by chemical vapor deposition. The LiF deposited primarily on the line defects and point defects of h-BN, creating seams that hold h-BN crystallites together. The chemically and mechanically stable hybrid LiF/h-BN film successfully suppressed lithium dendrite formation during initial electrochemical deposition onto a copper foil and during subsequent cycling. The protected lithium electrodes were cycled more than 300 times with high Coulombic efficiency, in an additive-free carbonate electrolyte.

Introduction:

h-BN, a 2D atomic crystal, has emerged as an attractive material for various applications in electronics and optoelectronics, due to its unusual electrical and optical properties. In addition, it has superior chemical inertness, making it stable against most chemicals such as oxygen and Li metal. Perfect single atomic layer of h-BN has very strong mechanical strength with a predicted in-plane Young's modulus approaching about 1.0 TPa. Due to these advantages, h-BN can be used as a stable coating that prevents metal oxidation at high temperature and suppresses lithium dendrite formation during electrochemical lithium metal plating. Many of the above-mentioned applications involve large-area and high-quality h-BN. While chemical vapor deposition (CVD) has emerged as one of the most powerful methods to prepare high-quality h-BN, CVD h-BN still has numerous defects intrinsic to the synthesis and transfer processes. H—BN prepared by CVD is typically polycrystalline and has a grain size on the order of a few hundred nanometers to a few tens of micrometers with a high density of point defects. Moreover, the transfer processes of 2D materials also introduce different kinds of defects such as cracks and wrinkles. These defects serve as a double-edged sword. On the one hand, their existence may compromise the effectiveness of h-BN as a stable interfacial layer in the above-mentioned applications. On the other hand, due to the strong B—N bonds, the pristine h-BN lattice is rather chemically inert; however, defects surrounded by dangling bonds provide possible anchoring sites for selective chemical modification to take place on h-BN. The defects can provide rich chemistry to tune the properties of h-BN.

Enhanced chemical reactivity can occur at the edge and defect sites in graphene, but such a case study of h-BN remains to be performed. The chemical functionalization at defect sites can greatly improve the chemical and mechanical stability of h-BN, which is especially important for h-BN when applications such as surface protection is of interest. For instance, grain boundaries can present mechanically weakened points, and therefore a single layer h-BN with small grain sizes has smaller elastic modulus and tensile strength compared to a defect-free, single crystalline, single layer h-BN. For multilayer and bulk 2D materials, degradation through chemical and electrochemical exfoliation also can occur.

With respect to using CVD h-BN as an interfacial layer, the weak bonding at the domain boundaries can present issues for maintaining the stable interface over long cycling. In this example, the selective atomic layer deposition (ALD) of LiF is performed on CVD h-BN and its application is proposed as a chemically and mechanically stable interfacial layer for stable Li metal cycling. The selective deposition, via ALD, allows deposition of LiF onto defect sites of CVD h-BN and void space where there is little or no h-BN coverage. The selectivity was confirmed by atomic force microscopy (AFM), Auger spectroscopy, scanning electron microscopy (SEM) and transmission electron microscopy (TEM). LiF is a main component in SEI in Li-ion batteries and it has a wide electrochemical stability window, which makes it stable against Li metal. The addition of LiF can improve the stability of Li metal anode during cycling. Therefore, LiF is a desirable candidate to serve as molecular stiches that hold polycrystalline CVD h-BN domains strongly together using selective ALD. The chemically and mechanically stable hybrid LiF/h-BN film successfully suppressed lithium dendrite formation during initial electrochemical deposition onto a copper foil and during subsequent cycling. The protected lithium electrodes were cycled more than 300 times with high Columbic efficiency, in an additive-free carbonate electrolyte.

Results:

Polycrystalline h-BN was prepared in a custom-built CVD system using heated ammonia borane as the precursor at a growth temperature of about 1000° C. on copper (Cu) foils (see additional growth details in the methods section). The morphology and coverage of CVD h-BN on Cu can be carefully controlled by adjusting precursor feeding rates and growth durations. Single layer h-BN exhibited the typical triangular shape with short growth durations and h-BN triangle domains then merged to form a continuous film with longer growth durations (see supporting information). As-grown CVD h-BN was then transferred onto Si substrates with a poly(methyl methacrylate) (PMMA) support for further characterization.

ALD of LiF was carried out using lithium tert-butoxide and titanium fluoride ($TiF_4$) as precursors at a growth temperature of about 250° C. (see additional deposition details in the methods section). It was performed on various substrates including pristine Si, Cu and stainless steel (SS). ALD has an ability to achieve a conformal coating. For instance, the ALD LiF film developed was highly uniform on pristine Si, Cu and SS substrates with just 50 ALD cycles (see supporting information). Conversely, the ALD LiF deposition on h-BN is selective and does not cover the entire substrate. For comparison, h-BN/Si before and after ALD LiF deposition was characterized by SEM (FIG. 1). While pristine h-BN appears to form a complete coverage on Si (FIG. 1b left), point defects and line defects cannot be revealed by SEM due to the constraint of resolution. After LiF deposition, a considerable number of nanowires and nanoparticles were deposited on the seemingly continuous h-BN layer (FIG. 1b right), indicating the nature of selective ALD LiF deposition on h-BN. The formation of nanowires and nanoparticles might relate to the preferred nucleation of LiF on the line defects and point defects of CVD h-BN. Such phenomena are more noticeable at the edges of h-BN; here LiF nanowires often originated from where two h-BN domains meet. Such selective deposition to form LiF nanowires and nanoparticles on h-BN were universal for ALD LiF deposition with different amounts of ALD cycles from 25 cycles to 150 cycles (see supporting information).

Figure 1A:
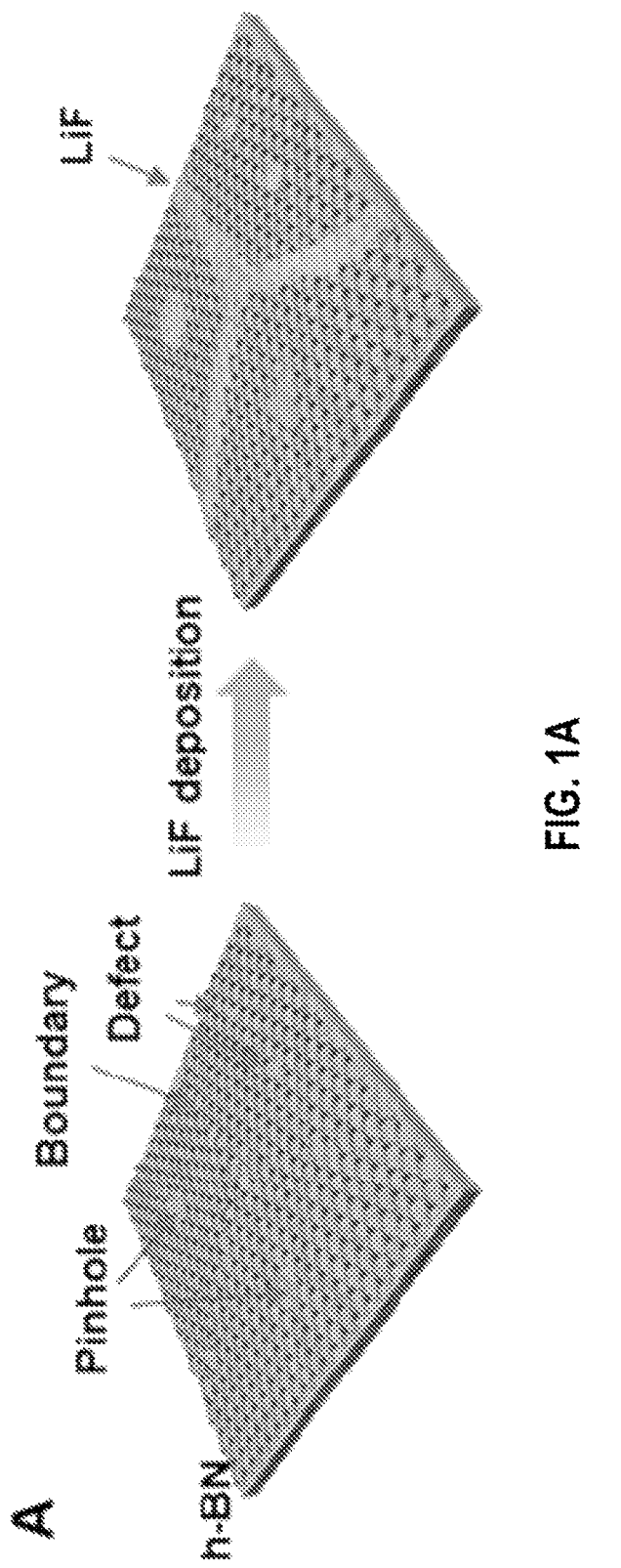
FIG. 1. Scanning electron microscopy (SEM) characterization. (a) Schematics of selective atomic layer deposition (ALD) of lithium fluoride (LiF) on hexagonal boron nitride (h-BN); (b) SEM characterization of 50 cycles of ALD LiF deposition on seemingly continuous h-BN; and (c) SEM characterization of 50 cycles of ALD LiF deposition on the edge of h-BN.
Figure 1B:
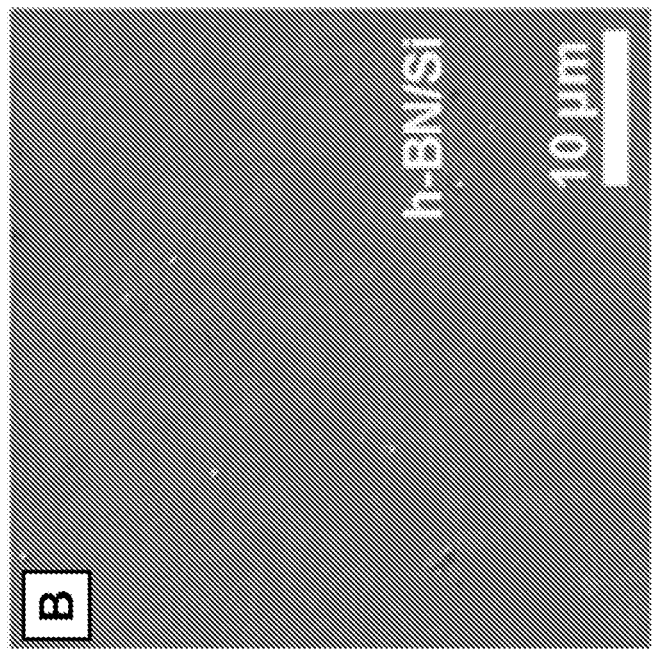
Figure 1B:
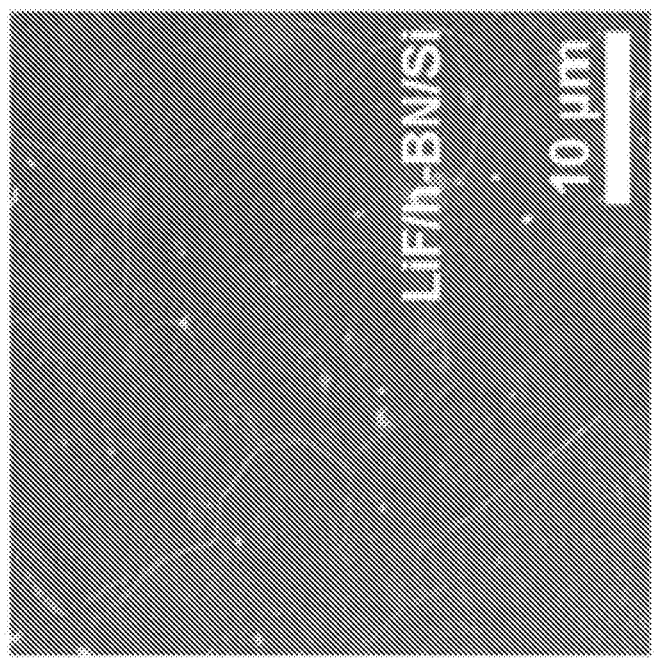
Figure 1C:
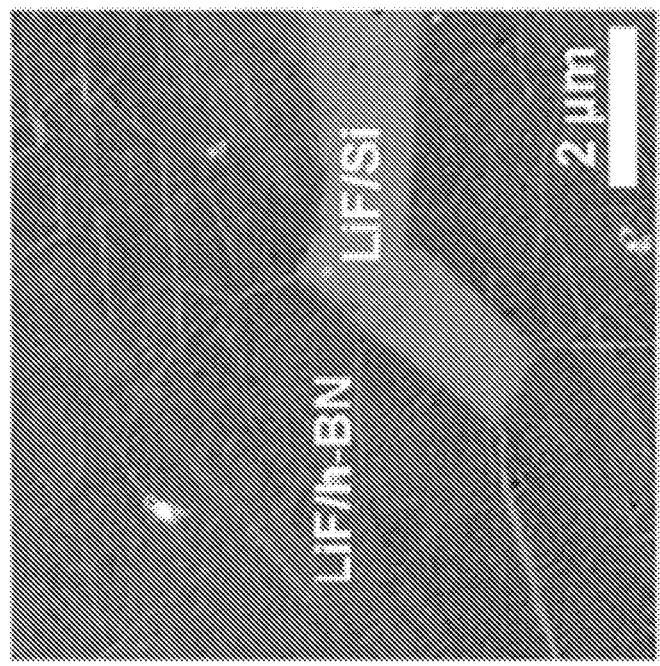
Figure 1C:
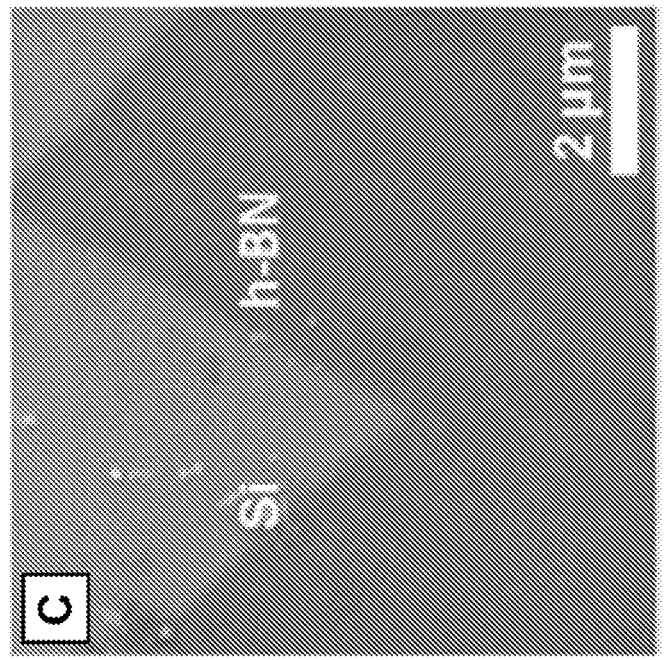
Figure 2A:
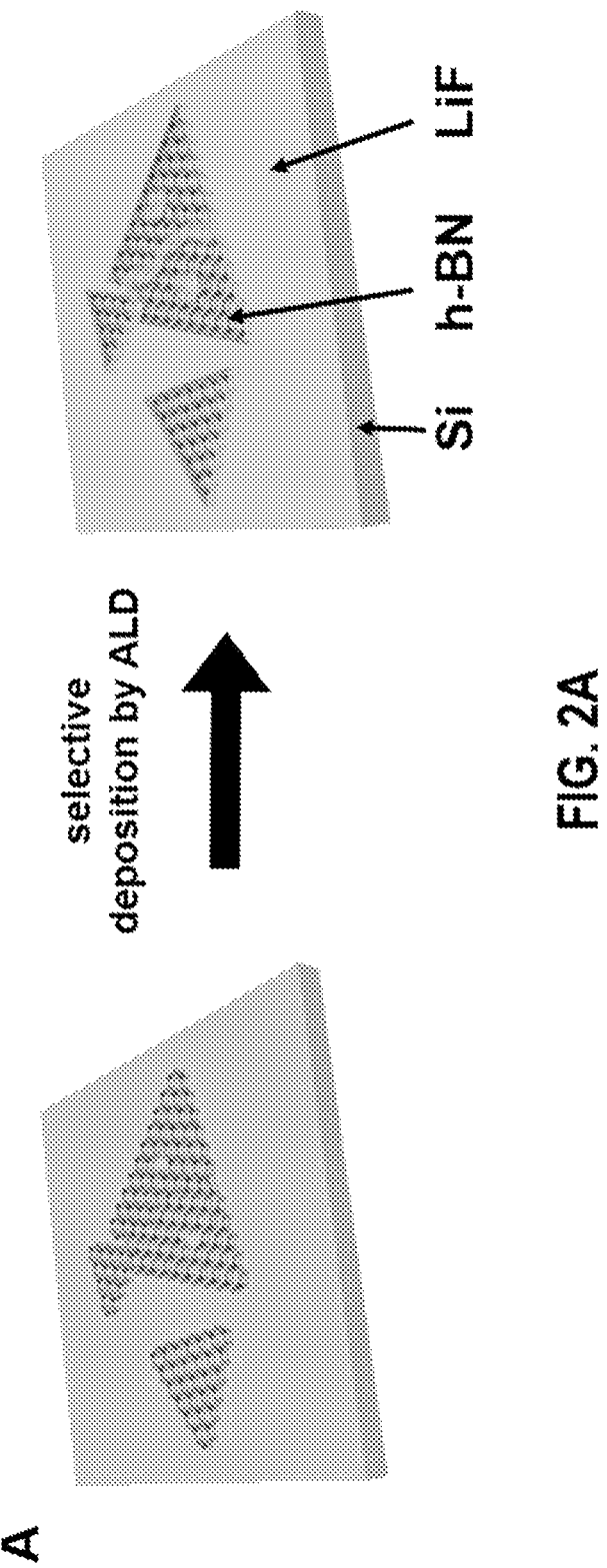
FIG. 2. (a) Top-view and side-view schematics of selective ALD LiF deposition on h-BN/silicon (Si); (b) atomic force microscopy (AFM) characterization of single layer h-BN on a Si substrate; (c) height profile of single layer h-BN on a Si substrate; (d, e) height profiles of ALD LiF coated single layer h-BN on a Si substrate; (f) AFM characterization of ALD LiF coated single layer h-BN on a Si substrate; (g) elemental mapping of N, B and F using Auger spectroscopy for h-BN/Si; and (h) elemental mapping of N, B and F using Auger for LiF/h-BN/Si.
Figures 2B, 2C, 2D, 2E, 2F:
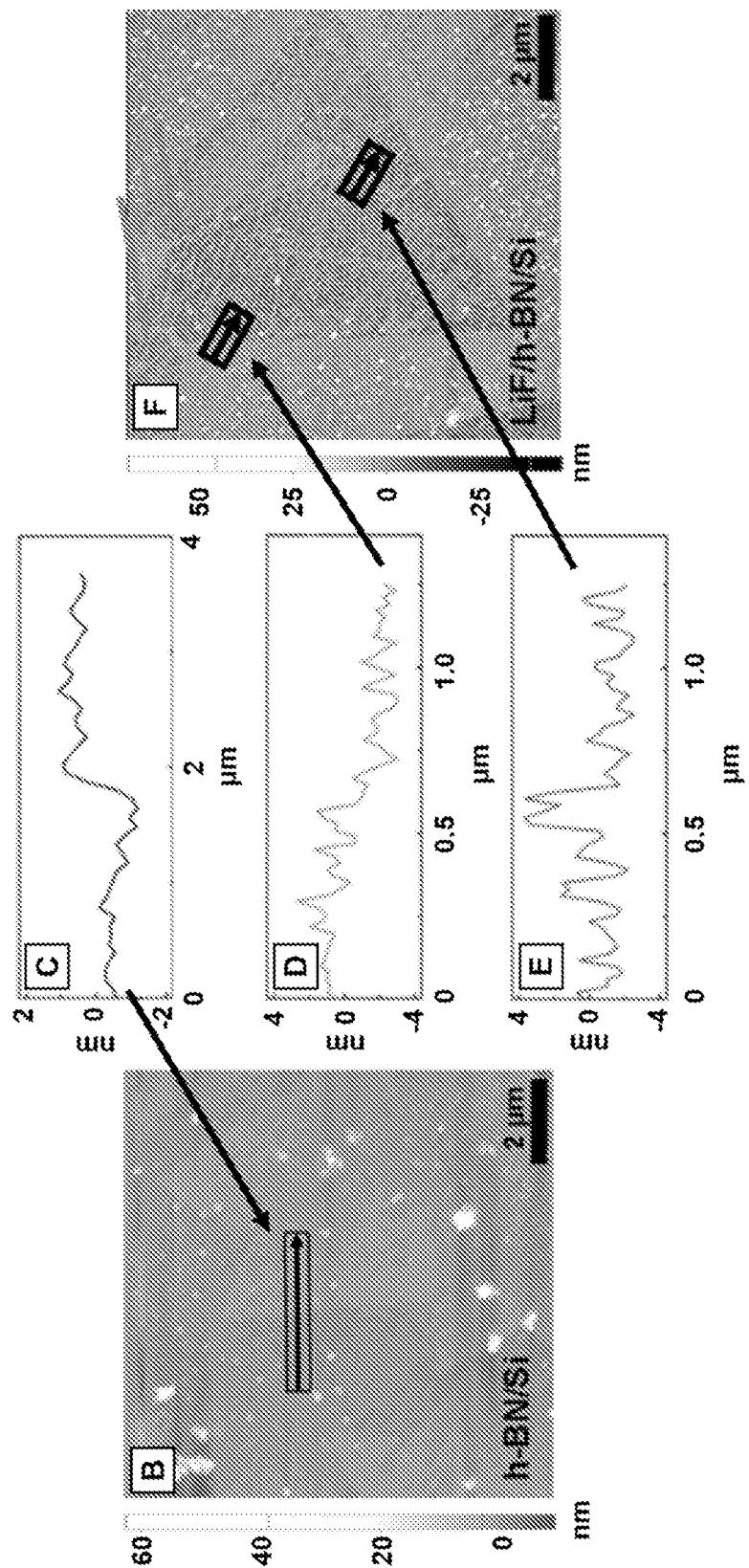
Figure 2G:
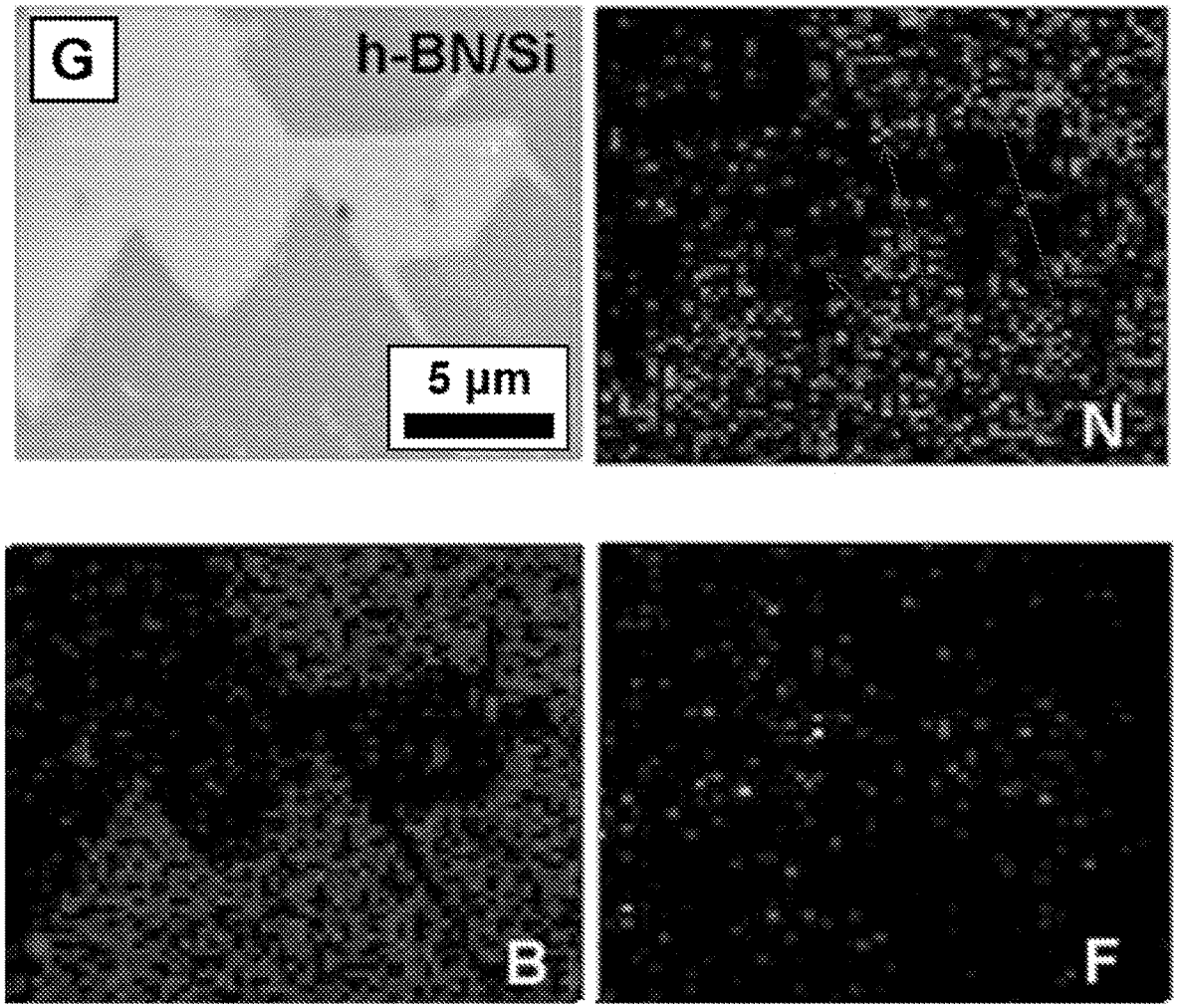
Figure 2H:
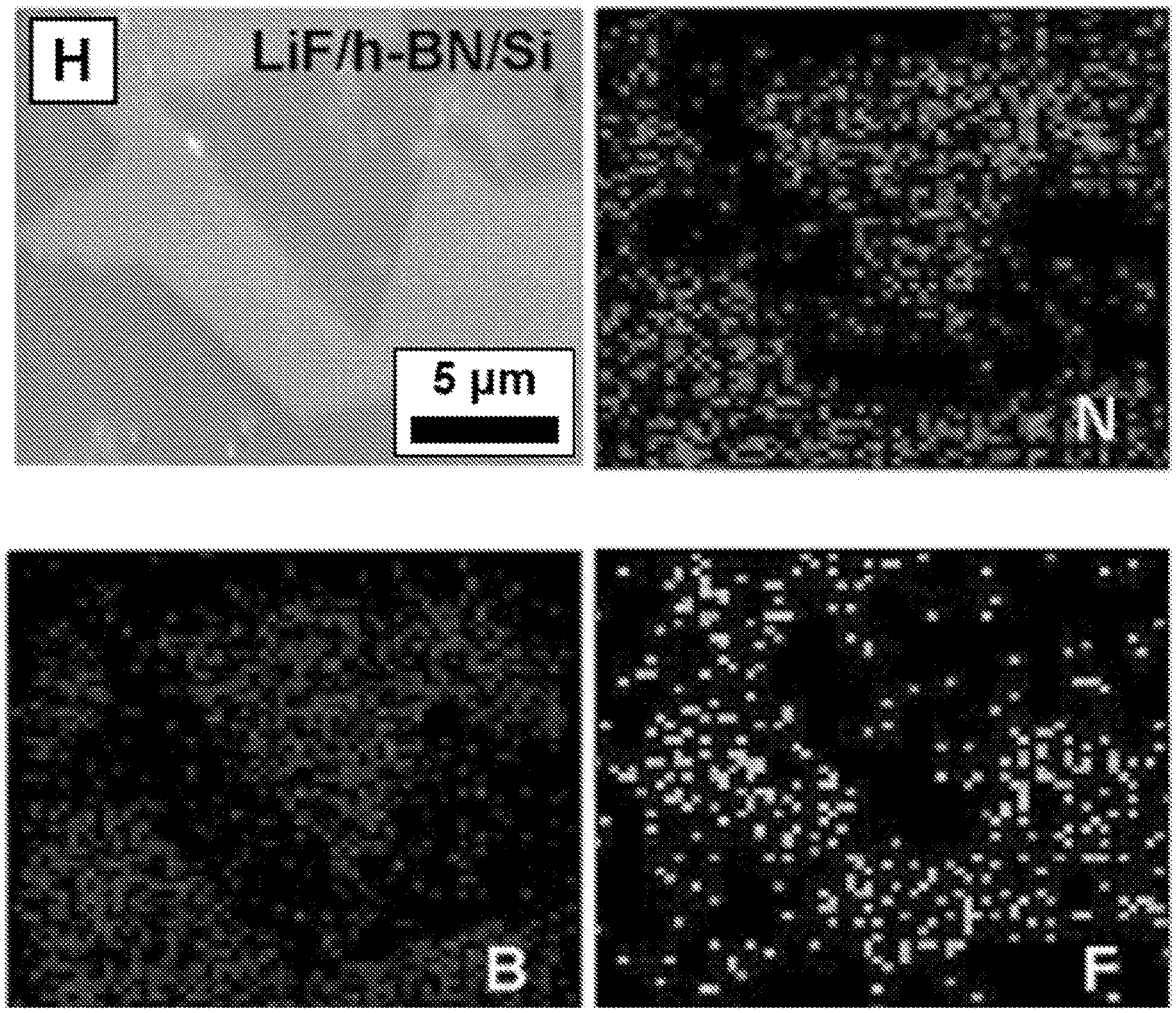

To further analyze the LiF/h-BN hybrid film, morphologies and height profiles of single layer h-BN with and without ALD LiF deposition were examined by using AFM. Single layer h-BN film was about 1 nm higher than the Si substrate itself (FIGS. 2b and 2c). After 50 cycles of ALD LiF deposition, the region covered by the h-BN film became lower than the Si substrate without h-BN coverage (FIGS. 2d and 2f). Such discrepancy in height increment observed on Si and h-BN after ALD LiF deposition can be attributed to the different chemical reactivities of Si and h-BN substrates. The native oxide on Si substrate provides rich surface hydroxide functional groups, which can readily react with ALD precursors to initiate the nucleation of LiF. On the contrary, the pristine h-BN film with saturated B—N bonds lacks surface dangling bonds to react with ALD precursors except at defect sites. The nucleation of LiF on the h-BN surface is therefore substantially prohibited and the average height gain on h-BN was much less than the height gain on Si. In addition to AFM characterization, the uneven nucleation of LiF on Si and h-BN was confirmed using Auger characterization (FIGS. 2g and 2h). The elemental distributions of boron, nitrogen and fluorine were mapped. For pristine h-BN on Si, the distribution of boron and nitrogen agreed well with the electron microscopy image. After ALD LiF deposition, the fluorine signal intensified, especially where there was no initial h-BN coverage. Both AFM and Auger characterizations confirmed the suppressed LiF nucleation on h-BN compared to on Si.

Nevertheless, observation is made of height gain on defect sites (highlighted by arrows in FIG. 2f). CVD h-BN growth can start with triangular shaped single crystals; however, the formation of grain boundaries with aligned dislocations results when crystal domains meet with longer growth durations (see supporting information). Moreover, two types of dislocations including pentagon-heptagon (5-7) pair and square-octagon (4-8) pair can occur. The 5-7 pair carries net positive charge at the B-rich side and negative charge at the N-rich side. It also contains homoelemental bonding (either B—B or N—N), which is less stable than heteroelemental bonding (B—N). While the 4-8 pair does not contain homoelemental bonding, it has a higher stain energy caused by the distorted rings. The net charge and less stable homoelemental bonding, along with high strain energy, altogether make the h-BN prone to react chemically at the grain boundaries. In addition to the enhanced chemical reactivity at the grain boundaries, point defects such as vacancies in h-BN may serve as anchoring sites for incoming ALD precursors due to the existence of dangling bonds (N—H or B—H) at the edge. Therefore, both nanowires and nanoparticles of LiF were observed in the SEM and AFM characterizations. Such selective growth of ALD LiF on h-BN is significant and can in principle (1) map out point defects and line defects in h-BN; (2) seal pinholes caused by CVD growth and post-growth transfer; and (3) improve the overall mechanical properties of h-BN film.

Figures 3A, 3B, 3C:
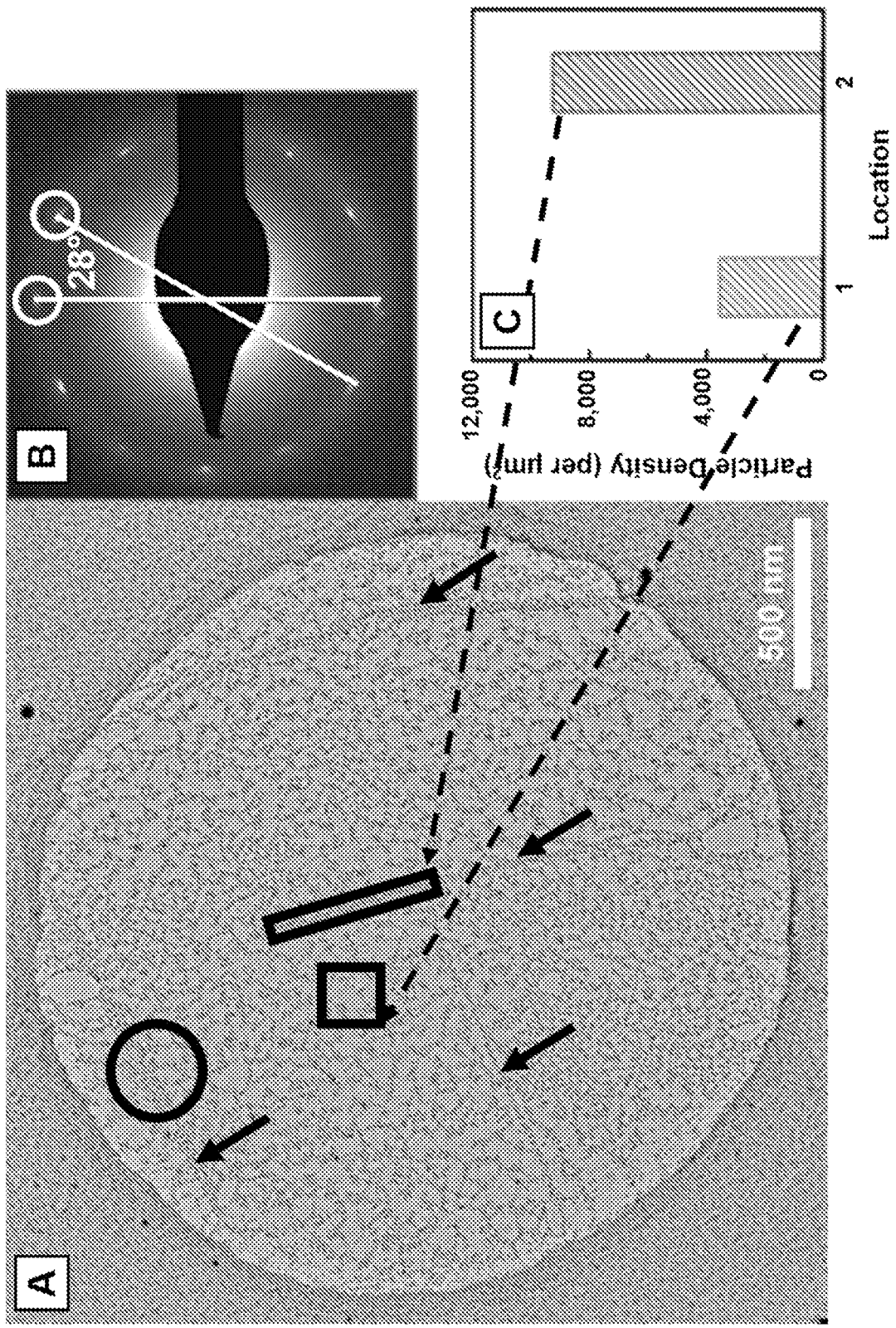
FIG. 3. Transmission electron microscopy (TEM) characterization. (a) TEM characterization of ALD LiF deposition on suspended h-BN; (b) diffraction pattern of highlighted circular area; and (c) comparison of particle densities of highlighted square and rectangular areas.

To further verify the enhanced nucleation at the grain boundaries of h-BN, TEM characterization is employed to provide direct evidence. H—BN was suspended on a gold (Au) TEM grid with about 2 µm openings using a PMMA-assisted transfer method (see methods section). After annealing in $Ar/H_2$ environment at about 380° C., the TEM grid with suspended h-BN was subjected to ALD LiF deposition directly. Consistent with SEM characterization, TEM confirmed the scattered LiF nucleation and preferred LiF nucleation along certain lines (highlighted by arrows). Here it is noted that the nucleation density of LiF on suspended h-BN observed in TEM was higher than the nucleation density of LiF on h-BN/Si observed in SEM. Such difference might be because LiF can nucleate on both sides of the suspended h-BN on the TEM grid compared to one side of h-BN on Si. The nucleation density of ALD LiF particles on suspended h-BN was about 3500 per $\mu m^2$, indicating a high density of point defects. The nucleation density of LiF particles along grain boundaries was about two times higher (FIG. 3c). A diffraction pattern was acquired in the highlighted circular area where there is a LiF line crossing (FIG. 3b). It showed two sets of h-BN diffraction patterns, which confirm the existence of a grain boundary of CVD h-BN.

With a Gibbs formation energy of about −587.7 kJ/mol, the thermodynamically stable electrochemical window of LiF is as wide as 0 to about 6.1 V vs. $Li^+/Li$. Being a main component in SEI, LiF is also chemically stable against various reactive species in a battery including Li metal and HF. Therefore, LiF is a potential candidate to function as a stable interfacial layer. A possible concern of using LiF as a protection layer lies mainly in its poor Li ion conductivity. Nevertheless, such concern can be alleviated if an ultrathin layer or a composite layer can be obtained. Here, ALD provides a way to fine-tune a coating thickness of LiF thin films or a size of LiF nanoparticles to address the poor ionic conductivity of LiF.

Figures 4A, 4B, 4C:
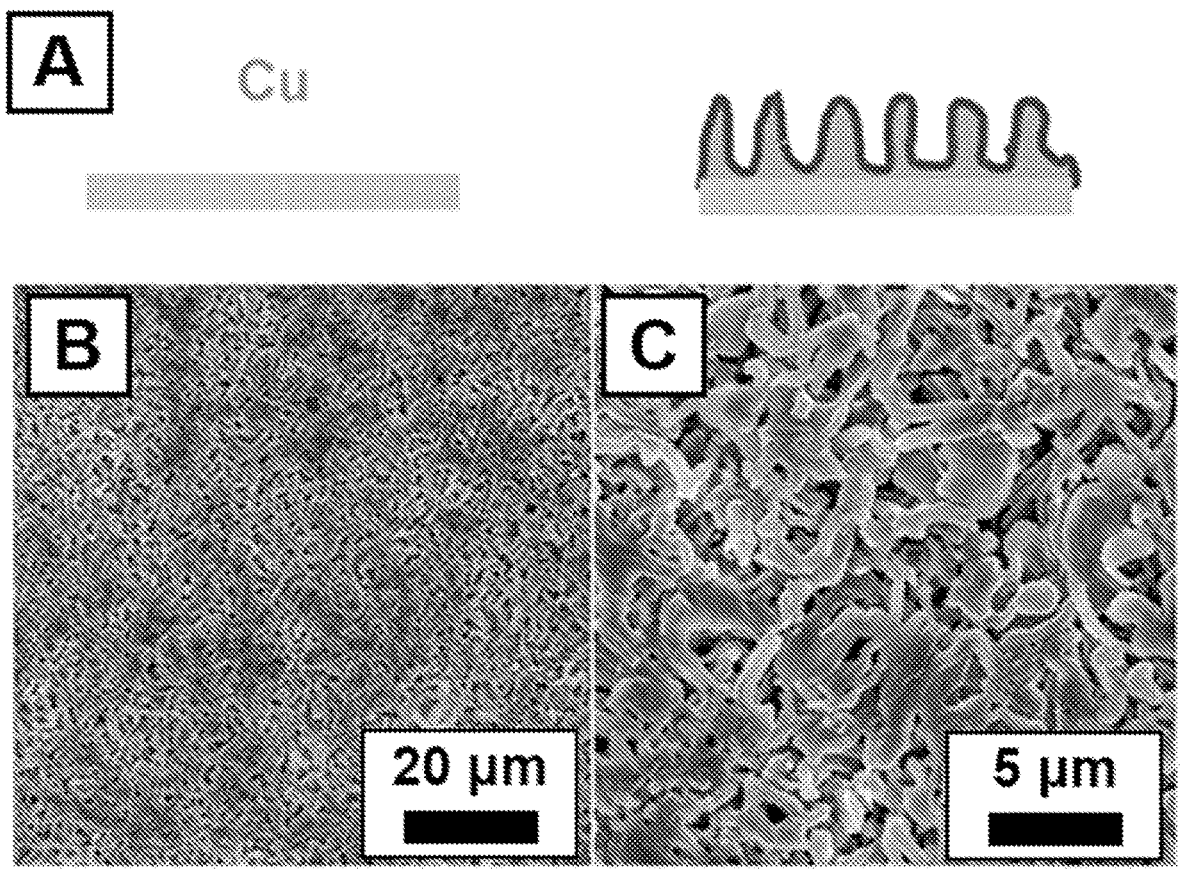
FIG. 4. Schematics and SEM characterization of Li plating on copper (Cu) (a-c); h-BN/Cu (d-f); LiF/Cu (g-i) and LiF/h-BN/Cu (j-l). Li plating was performed at a rate of about 0.5 mA/$cm^2$ and a total capacity of about 1 mAh/$cm^2$ in ethylene carbonate (EC)/diethyl carbonate (DEC) electrolyte with about 1 M $LiPF_6$.

Evaluation is made of the morphology of Li plating in additive-free carbonate electrolyte on various substrates using SEM. The Li plated on Cu exhibited the typical dendritic growth (FIG. 4a-4c). The Li whiskers have irregular shapes and a mean diameter in the range of about several hundred nanometers. However, it is found that the electrochemical plating of Li on ALD LiF/Cu (FIG. 4g-4i) was even less uniform than that on pristine Cu. The plated Li on LiF/Cu did not cover the entire substrate and it was dendritic in nature. Direct deposition of LiF on the current collector may present various challenges. First, the LiF film deposited by ALD has strong chemical bonding with the underlying Cu foil. Second, LiF has a poor electrical conductivity. Therefore, the initial nucleation of Li plating preferentially takes place between LiF particles rather than underneath it. Even if some Li managed to deposit underneath the LiF film, it will crack the LiF film because LiF is not mechanically flexible. Once the nucleation occurs, further Li deposition is preferential on the existing nucleation sites rather than forming additional Li nuclei on top of the nonconductive LiF film or underneath the LiF film by breaking the LiF shell. The low nucleation density leads to a high initial plating overpotential and non-uniform plating.

Figures 4D, 4E, 4F:
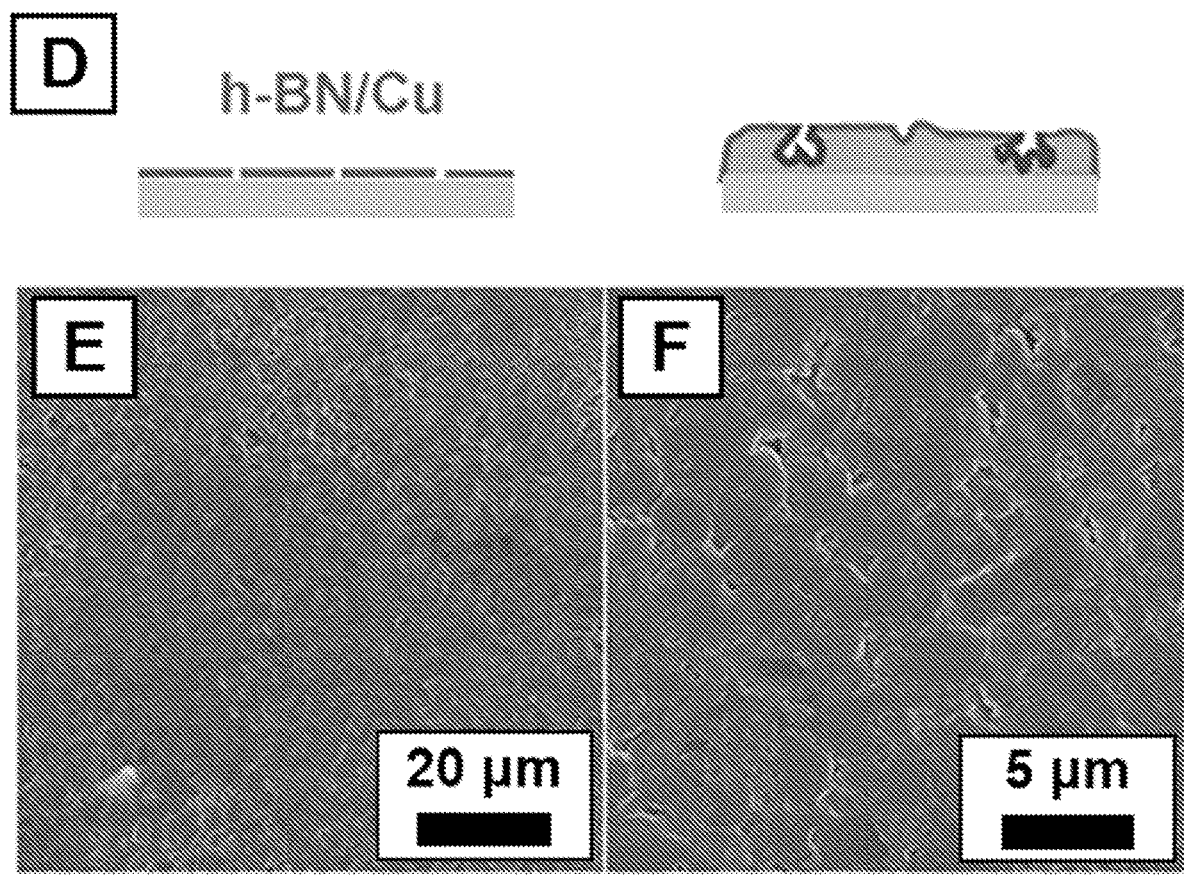
Figures 4G, 4H, 4I:
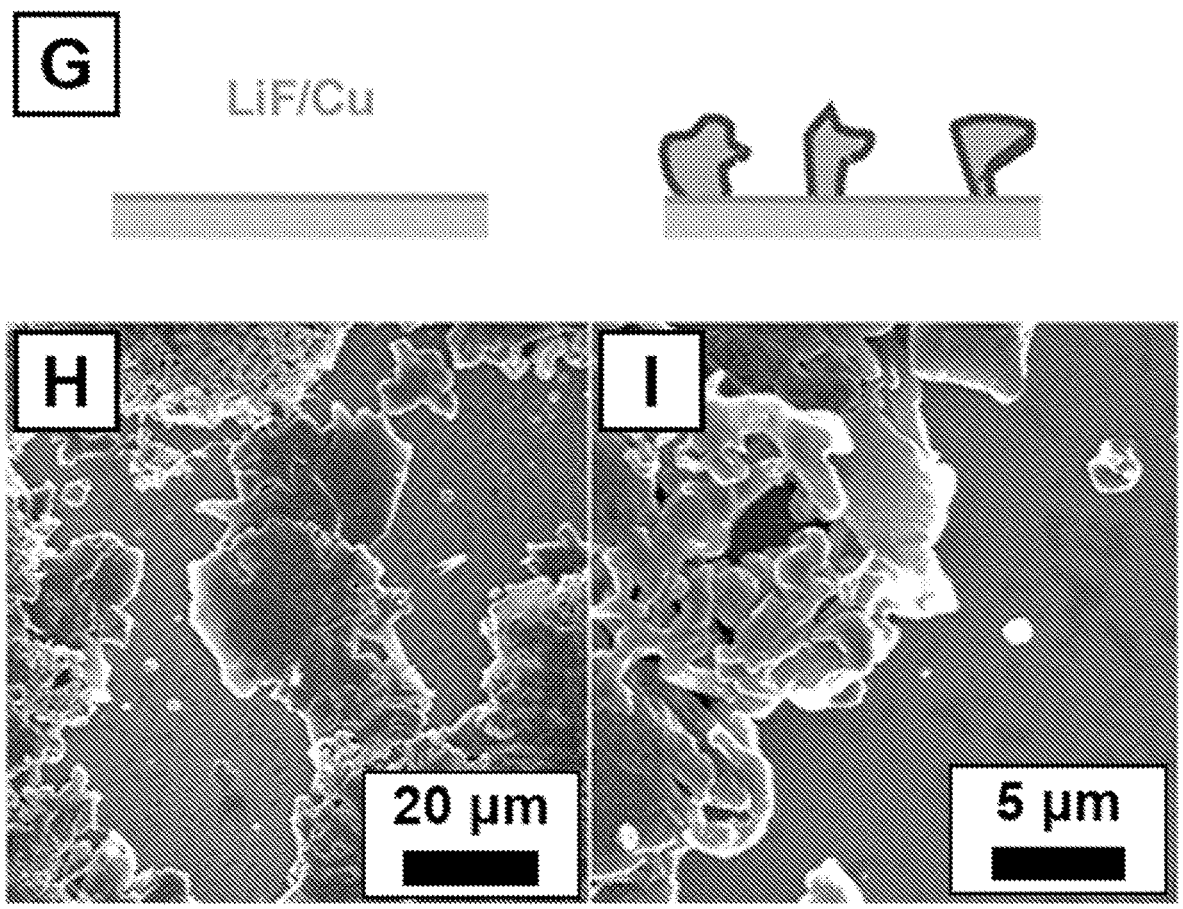

Compared to the nature of strong chemical binding between LiF and Cu, the physical interaction between h-BN and Cu is considerably weaker. For instance, 2D materials such as graphene can be lifted from a substrate via hydrogen generation. h-BN can be lifted by Li plated underneath. However, in spite of a high theoretical in-plane Young's modulus, the grain boundaries are predicted to be the weak points of h-BN when tensile stress is applied. While starting with a seemingly continuous CVD h-BN film, holes appeared after Li plating (FIG. 4d-4f). Upon closer inspection, dendritic Li was found to be growing within such holes. Such holes can be a result of (1) the broken film at the weak grain boundaries or point defects due to stress induced by Li plating; (2) pinholes remaining after the CVD growth; or (3) cracks caused by the transfer process.

Figures 4J, 4K, 4L:
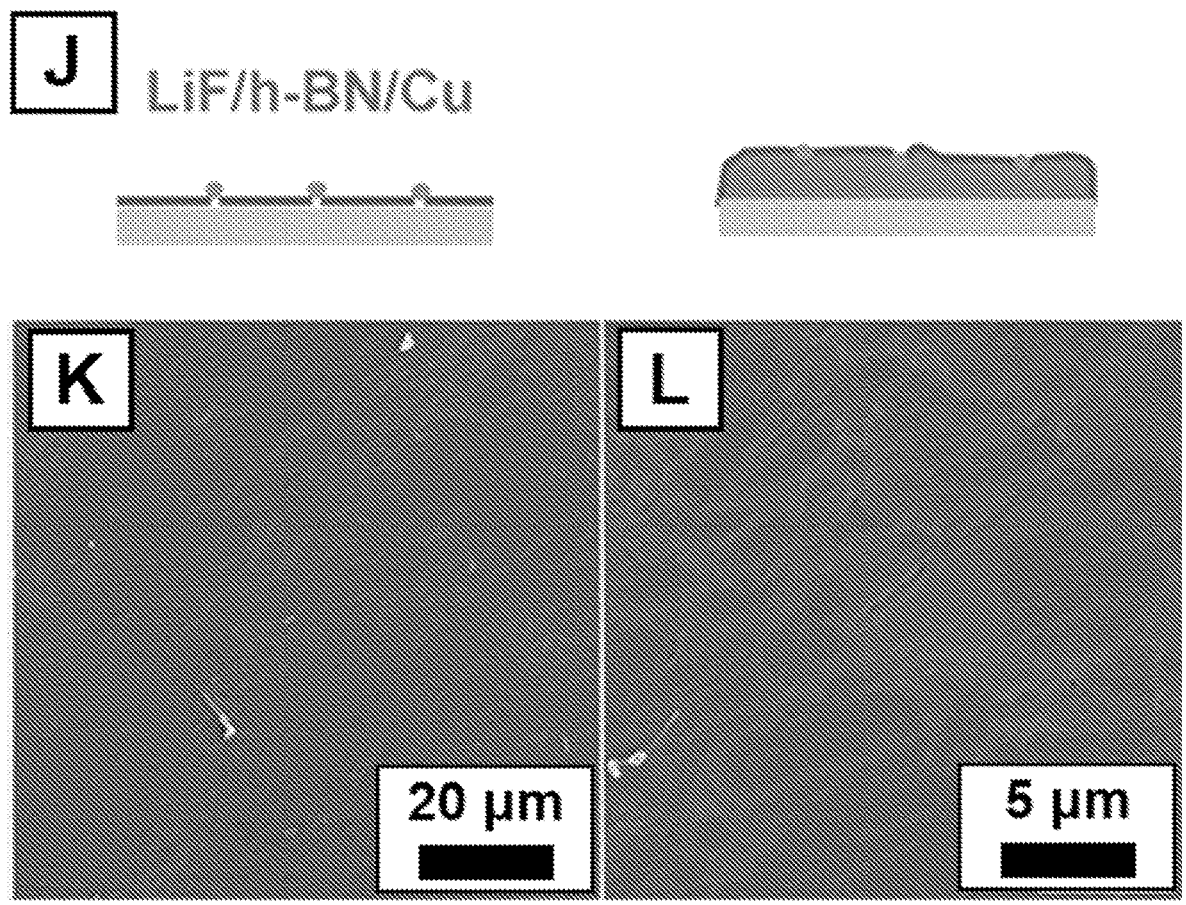

Using the LiF/h-BN hybrid film as the interfacial layer combines the advantages of both components. First, the weak physical interaction between h-BN and Cu allows Li to be plated in between h-BN and Cu. Second, with the addition of chemically stable LiF linkers, the overall mechanical strength of LiF/h-BN was improved. It also helps to seal any pinholes or cracks induced in the CVD synthesis and transfer. The superior chemical and mechanical stability of the LiF/h-BN combination effectively suppressed the Li dendrite formation. The resulting electrochemical plating of Li is smooth and uniform (FIG. 4j-4l).

Long-term Li plating/stripping experiments were also conducted on Cu, h-BN/Cu, LiF/Cu and LiF/h-BN/Cu substrates in an ethylene carbonate (EC)/diethyl carbonate (DEC) electrolyte with about 1 M LiPF$_6$ containing no additives (FIG. 5). About 1 mAh/cm$^2$ of Li was plated on the corresponding working electrode at a rate of about 0.5 mA/cm$^2$. The working electrode was then cycled to a cut-off potential of about 2.0 V vs. Li$^+$/Li at the same rate of about 0.5 mA/cm$^2$ to strip the deposited Li. The Coulombic efficiency was specified as the Li stripping capacity divided by the Li plating capacity for each cycle. The Coulombic efficiencies on the Cu substrate steadily decreased as cycling progressed, dropping to about 70% in 90 cycles, indicating significant side reactions between Li and electrolyte. The consumption of Li and electrolyte through side reactions is undesirable for achieving a long-term stable Li metal anode.

Figure 5A:
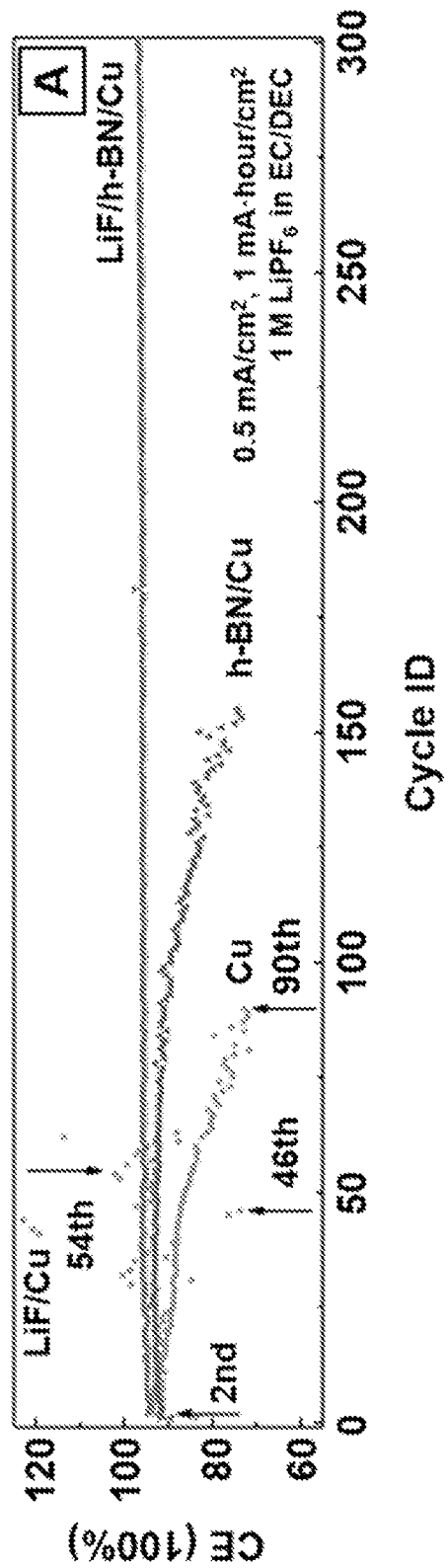
FIG. 5. Cycling performance of repeated Li plating/stripping on Cu, h-BN/Cu, LiF/Cu and LiF/h-BN/Cu substrates in EC/DEC electrolyte containing about 1 M $LiPF_6$. (a) Coulombic efficiency vs. cycle number plots; (b) voltage vs. capacity plot during $2^{nd}$ cycle; (c) voltage vs. capacity plot during $46^{th}$ cycle; (d) voltage vs. capacity plot during $54^{th}$ cycle; and (e) voltage vs. capacity plot during $90^{th}$ cycle.
Figure 5B:
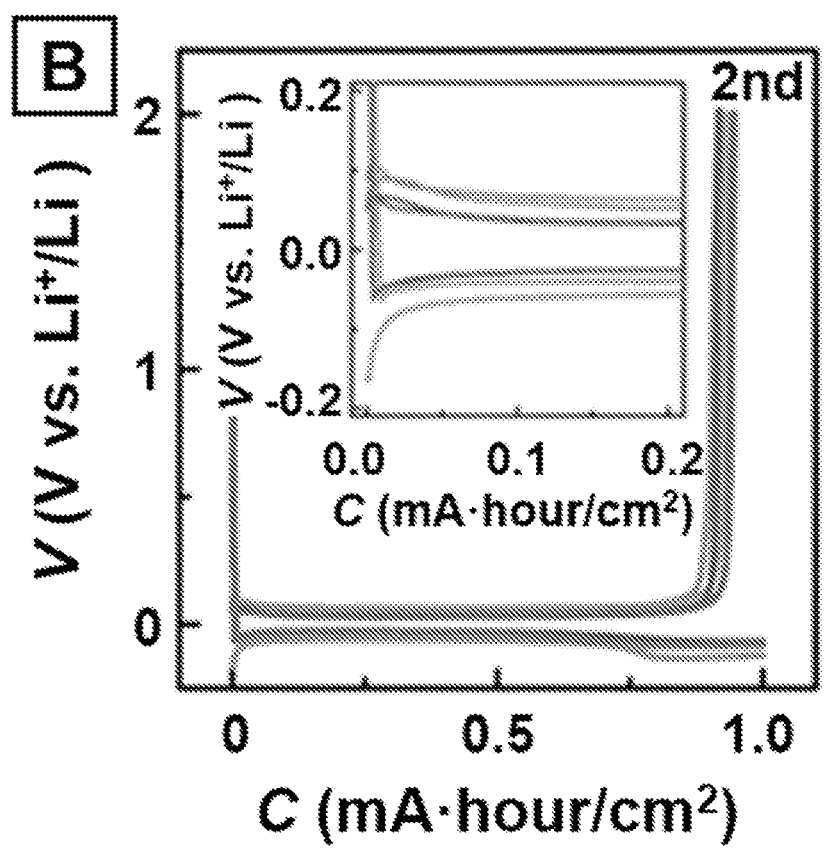
Figure 5C:
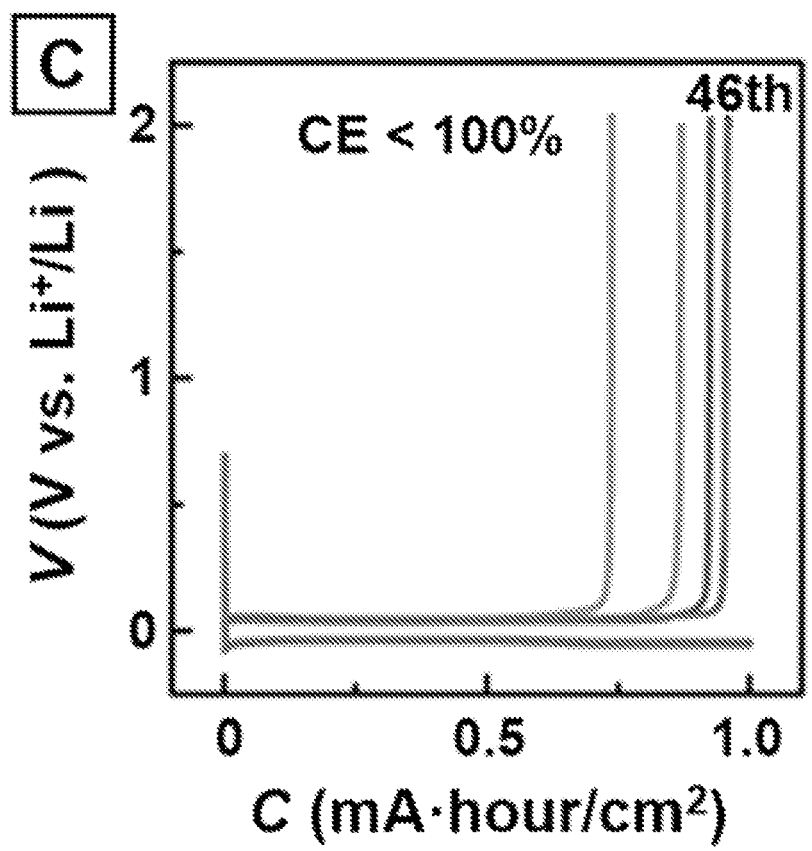
Figure 5D:
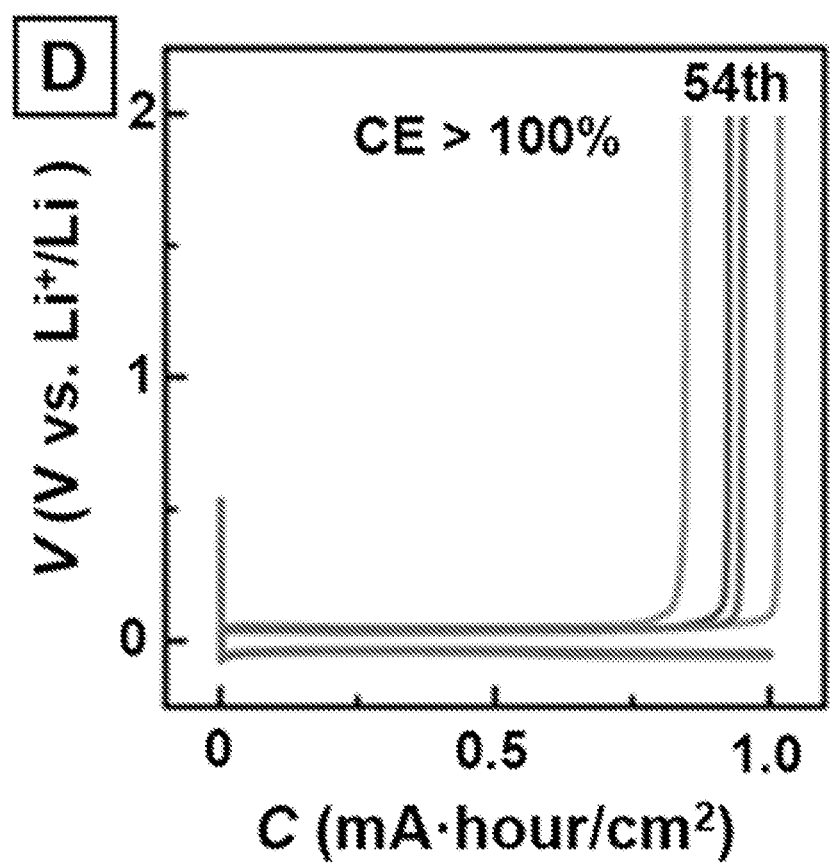
Figure 5E:
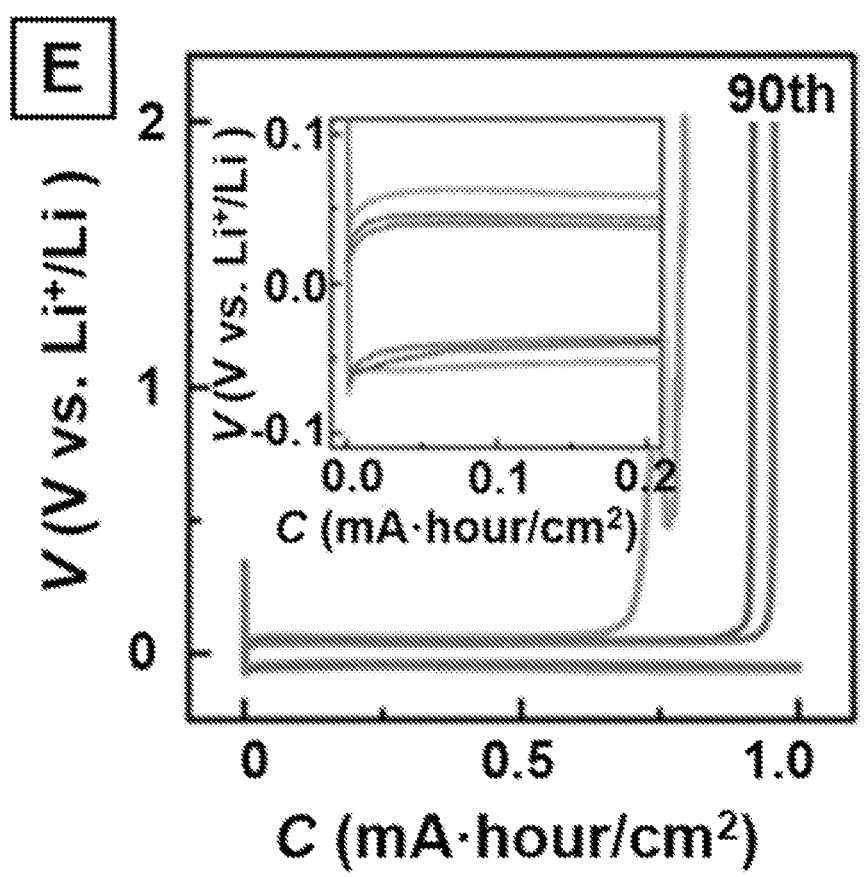

Among the three types of modified substrates, LiF/Cu had the poorest cycling performance, which was even worse than pristine Cu. As discussed above, the electrochemical Li plating on LiF/Cu was non-uniform across the substrate. Due to the poor conductivity of LiF and strong adhesion between LiF and Cu, the initial Li nucleation is difficult, leading to a high overpotential even though just a few nm of LiF was deposited (FIG. 5b). For comparison, the initial Li nucleation overpotentials on LiF/Cu and Cu substrates in the beginning of the 2$^{nd}$ Li plating half-cycle were about 164 mV and about 64 mV, respectively. The average Li plating overpotentials on LiF/Cu and Cu substrates throughout the 2$^{nd}$ Li plating half-cycle were about 80 mV and about 60 mV, respectively. In addition, that the Coulombic efficiency on the LiF/Cu substrate is fluctuating in its late cycles may indicate "dead" Li formation. Due to the poor electrical conductivity of LiF on Cu, when Li dendrites lose the physical connection to the underlying Li base, it is difficult to re-establish their electrical connection to the substrate as a significant portion of the substrate was covered with poorly conductive LiF. This disconnected Li then becomes "dead" Li, and observation is made of a low Coulombic efficiency (cycle 46 in FIG. 5c). In the following cycles, if "dead" Li re-establishes an electrical connection to the underlying Li by chance, observation is made of a Coulombic efficiency higher than 100% (cycle 54 in FIG. 5d). Collectively, cells using LiF/Cu as the current collector suffered from low Li nucleation density, high overpotential and poor Li plating uniformity, all contributing to their poor cycle performance.

In contrast, Li plating/stripping on h-BN/Cu was considerably more stable than on pristine Cu with both lower overpotentials and higher Coulombic efficiencies over long cycles. At the 2$^{nd}$ cycle, the initial nucleation barrier on h-BN/Cu was about 64 mV and the average Li plating overpotential was about 42 mV. The average Coulombic efficiency during the first 100 cycles was about 92.2%, which then dropped to about 70% after about 150 total cycles. As plating/stripping cycles progressed, h-BN layer may have slowly broken apart starting from defective sites and became exfoliated from the substrate, eventually losing its ability to reduce the side reactions between Li and the electrolyte.

Of note, LiF/h-BN/Cu stood out among the three types of modified substrates in the long-term cycle stability test. Benefiting from the weak interaction between h-BN and Cu, the Li plating readily took place underneath LiF/h-BN. At the 2$^{nd}$ cycle, the initial nucleation barrier on LiF/h-BN/Cu was about 60 mV and the average Li plating overpotential was about 47 mV (FIG. 5b). After 90 cycles, the average Li plating/stripping overpotential on LiF/h-BN/Cu was lower than that on pristine Cu (FIG. 5e), indicating less SEI build up. Indeed, the Li plating/stripping on the LiF/h-BN/Cu substrate maintained a high average Coulombic efficiency above about 96% for over 300 cycles in the carbonate electrolyte without the aid of any electrolyte additives. The significantly improved Coulombic efficiency indicates that the LiF/h-BN is effective in protecting Li from reacting with the electrolyte. The Coulombic efficiency versus cycle number curve was also the smoothest one among the four types of substrates, indicating a low degree of "dead" Li formation and detachment on LiF/h-BN/Cu. To summarize, the good cycle stability on LiF/h-BN/Cu resulted from (1) the low binding affinity between h-BN and Cu so that LiF/h-BN can be lifted by Li plated underneath; (2) strong mechanical property and stable chemical property of the LiF/h-BN hybrid film; and (3) reduced side reactions between plated Li and the electrolyte.

Figure 6A:
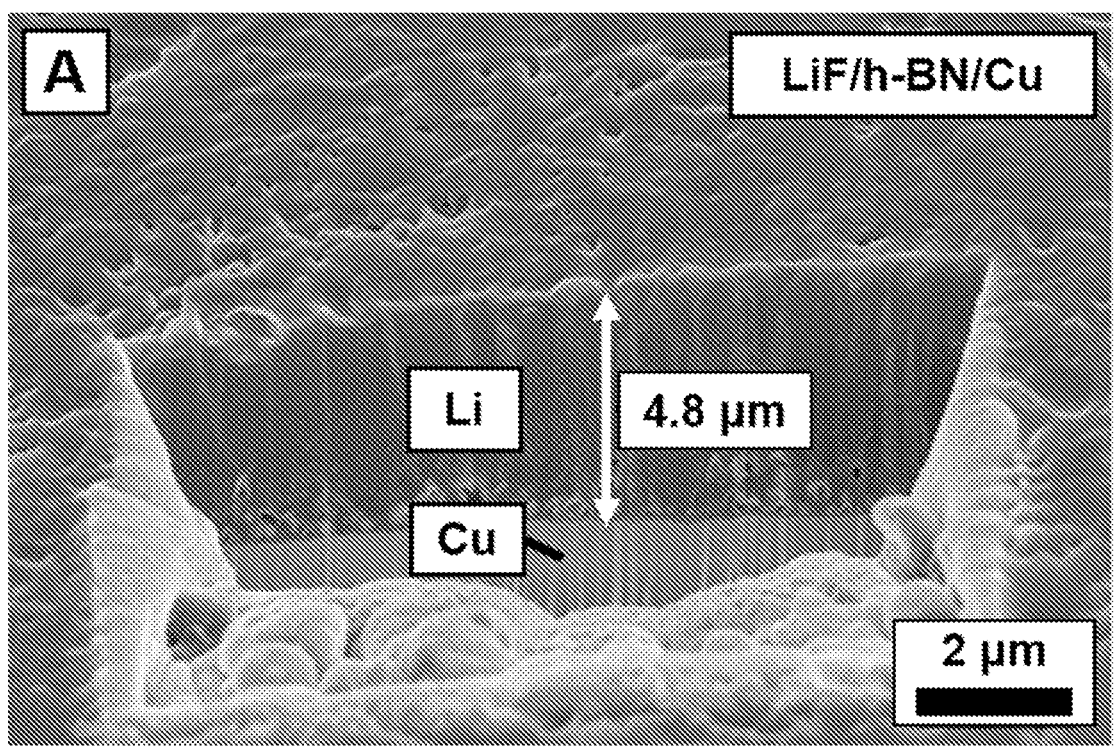
FIG. 6. SEM characterization of cross section morphologies of Li deposited on LiF/h-BN/Cu (a) and pristine Cu (b) substrates after 10 cycles in EC/DEC electrolyte with about 1 M $LiPF_6$.
Figure 6B:
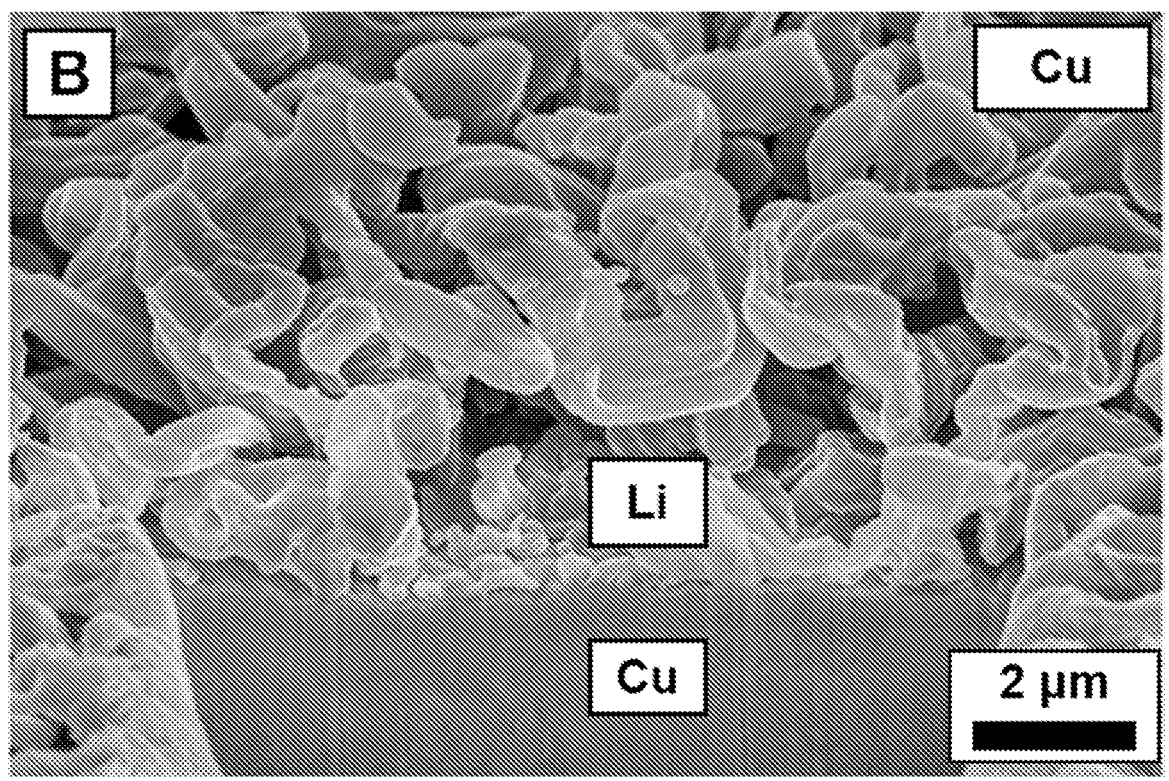

To further analyze the Li deposition morphology, cross section SEM images were acquired after ten repeated plating/stripping cycles (FIG. 6). Focused ion beam (FIB) was applied to cut freshly plated Li to better reveal the Li deposition morphology underneath the surface coating layer. Li plated on LiF/h-BN/Cu substrate was smoother on the surface, and also packed more densely underneath the surface compared to Li plated on pristine Cu. While there were still some void spaces at the interface between Li and Cu on LiF/h-BN/Cu substrate, these spaces were possibly caused by the initial nucleation of Li on Cu substrate. Individual Li grains then grew in size and merged eventually. On the contrary, the Li morphology remained dendritic after 10 repeated cycles on the surface of pristine Cu. Underneath the surface, void spaces were visible everywhere across different depths of plated Li. Such dendritic Li with high surface area is undesired for long-term cycling. The continuous formation and cracking of ineffective SEI upon Li volume change during plating/stripping would consume both active Li and electrolyte. This also explains the low Coulombic efficiency observed on pristine Cu electrode. Since Li is in excess in the counter electrode, the accumulation of a thick SEI and depletion of electrolyte were likely the cause for the battery failure. In comparison, with a stable LiF/h-BN hybrid film as an artificial SEI with strong mechanical property and stable chemical stability, the side reactions between Li and electrolyte can be reduced and the battery cycle life can be greatly extended.

Conclusions:

To summarize, demonstration is made of the selective atomic layer deposition of LiF at defect sites of h-BN with enhanced chemical reactivities. The selective deposition allows visualization of the location of defects in h-BN. The chemically and electrochemically stable LiF served as molecular stitches to seal the polycrystalline CVD h-BN. With its superior chemical and mechanical properties, the LiF/h-BN hybrid film effectively suppressed Li dendrite formation and improved the Coulombic efficiency of Li metal cycling during long cycles.

Methods:

Materials Synthesis and Preparation

ALD LiF deposition was performed on different types of substrates including Si, SS, Cu, BN/Si, and BN/Cu using a Savannah S100 ALD system (Cambridge Nanotech). The deposition included alternating pulse and purge of lithium tert-butoxide (about 97%, Sigma Aldrich) and $TiF_4$ (Sigma Aldrich) as precursors. $TiF_4$ was subjected to gentle grinding in an argon (Ar) glove box prior to use. The typical pulse and purge durations for lithium tert-butoxide sub-cycle are about 1 s and about 25 s, respectively. The typical pulse and purge durations for $TiF_4$ sub-cycle are about 0.1 s and about 25 s, respectively. Lithium tert-butoxide was heated to about 160-170° C. and $TiF_4$ was kept at about 115-125° C. High purity Ar was used as the carrier gas and purging gas. LiF thin films were obtained at a deposition temperature of about 250° C.

h-BN was synthesized in a custom-built CVD system. Prior to the deposition, Cu foil (about 99.8% Alfa Aesar) was electrochemically polished by holding about 1.5 V vs. Cu counter electrode for about 60 minutes in a mixture of phosphoric acid (about 70 wt. %) and ethylene glycol (about 30 wt. %) electrolyte. After rinsing and blowing dry, Cu foil was annealed under about 35 Standard Cubic Centimeters per Minute (sccm) $H_2$ and about 50 sccm Ar flow for about 30 minutes at about 1000° C. For the growth of h-BN, about 50 mg ammonia borane ($H_3N$—$BH_3$, about 97%, Sigma Aldrich) precursor was loaded into a glass tube attached to the deposition chamber. The precursor vapor was delivered to the deposition chamber when heated by a heating tape wrapping around the glass tube. The h-BN growth was carried out at about 1000° C. under about 35 sccm $H_2$ and about 50 sccm Ar flow.

h-BN was transferred to various substrates including Si, $SiO_2$ coated Si, Cu and TEM grid (Ted Pella, about 2 μm hole size) with PMMA support. A PMMA solution was spin-coated on the surface of the as-grown h-BN/Cu at the speed of about 500 rpm for about 60 s and about 4000 rpm for about 30 s. The backside of Cu foil was cleaned using $O_2$ plasma and gently wiped with an isopropyl alcohol (IPA) soaked cotton stick. The sample was then placed into a solution of iron chloride to etch the underlying Cu foil. The PMMA/h-BN films were rinsed with a diluted hydrochloric acid solution and deionized water for three times each. The PMMA/h-BN films were picked up by desired substrates and dried at about 60° C. PMMA was removed by soaking in acetone and then in IPA. Finally, samples were annealed in about 10 sccm $H_2$ and about 40 sccm Ar flow at about 380° C. for about 2 h to remove residual PMMA to obtain a clean h-BN surface.

Materials Characterizations

AFM was performed using Park XE-70 system with ACTA tips. SEM images of LiF, h-BN and LiF/h-BN on various substrates were captured in a FEI XL30 Sirion. A Woollam M2000 Spectroscopic Ellipsometer was used for measuring and fitting optical properties and thicknesses of ALD LiF films on Si substrates. TEM characterization was performed at about 80 kV using a FEI Titan. After Li plating/stripping cycling, samples were rinsed in 1,3-dioxolane (DOL) to remove residual electrolyte and salt for SEM imaging. The morphology of plated Li was observed with a focused ion beam (Nova 600i Dual Beam, FEI). The cycled electrodes were cross-sectioned with a $Ga^+$ ion beam and observed with SEM (JSM-6700F, JEOL).

Electrochemical Measurements

Battery cycling performance was evaluated by galvanostatic cycling of coin cells (CR 2032) with Cu, LiF/Cu, h-BN/Cu and Li/h-BN/Cu as the working electrodes and Li foils (Alfa Aesar) as the counter electrodes. The working electrodes and the counter electrodes were cut into round disks with a diameter of about 1 cm and separated by two layers of Celgard separators. About 30 μL solution of about 1 M $LiPF_6$ in about 1:1 (v:v) ethylene carbonate (EC) and diethyl carbonate (DEC) (BASF) was added as the electrolyte. No additional additive was added into the electrolyte. Battery cycling data was collected using a LAND 8-channel battery tester at room temperature. After assembly, coin cells were galvanostatically cycled between 0 V and about 2 V at about 50 μA/$cm^2$ for five cycles. Battery cycling was then performed by controlling about 1 mAh/$cm^2$ areal capacity for Li plating and a cut off potential of about 2 V vs. $Li^+$/Li for Li stripping during each cycle. The Coulombic efficiency was specified as the Li stripping capacity divided by the Li plating capacity.

Figures 7A, 7B, 7C, 7D:
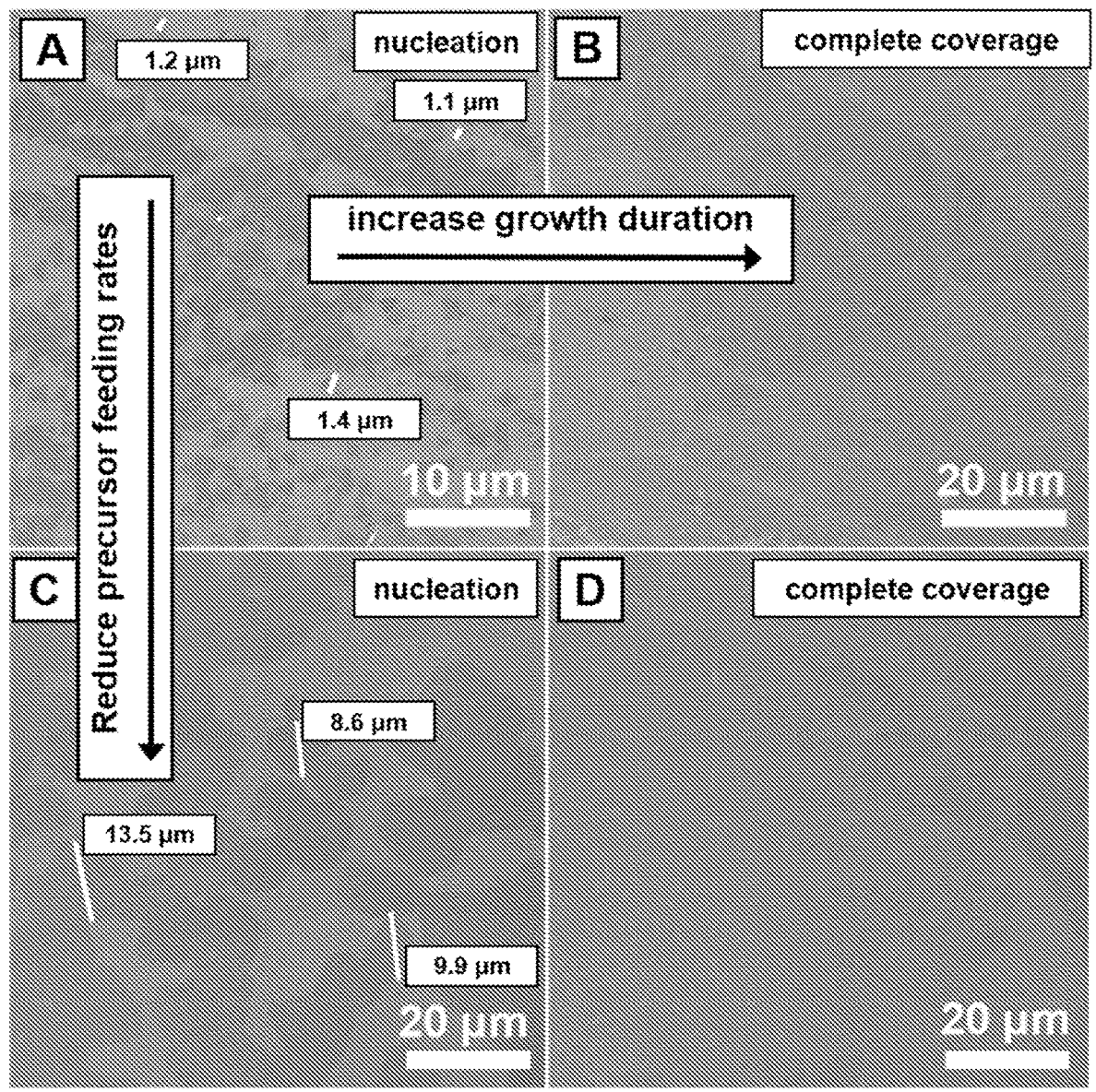
FIG. 7. SEM characterization of h-BN formed by chemical vapor deposition (CVD) with different precursor feeding rates and growth durations on Cu substrates. (a) About 90° C. precursor heating temperature and about 15 minutes growth time; (b) about 90° C. precursor heating temperature and about 60 minutes growth time; (c) about 70° C. precursor heating temperature and about 30 minutes growth time; and (d) about 70° C. precursor heating temperature and about 120 minutes growth time.

Supporting Information:

The morphology of h-BN films can be controlled by adjusting precursor feeding rates and growth durations. Using ammonia borane ($H_3N$—$BH_3$) as the precursor, its feeding rate is a function of precursor heating temperature. At a low precursor heating temperature, the slow feeding of precursor leads to h-BN with large domain sizes, or vice versa (FIGS. 7a and 7c). Continuous h-BN films covering the entire substrates can be obtained by extending the growth time (FIGS. 7b and 7d). For instance, at about 90° C. precursor heating temperature, small-sized triangular shaped h-BN crystals can be obtained with about 15 minutes growth duration (FIG. 7a). For comparison, at about 70° C. precursor heating temperature, continuous h-BN film with large domain sizes can be obtained with about 120 minutes growth duration (FIG. 7d).

Figures 8A, 8B, 8C, 8D:
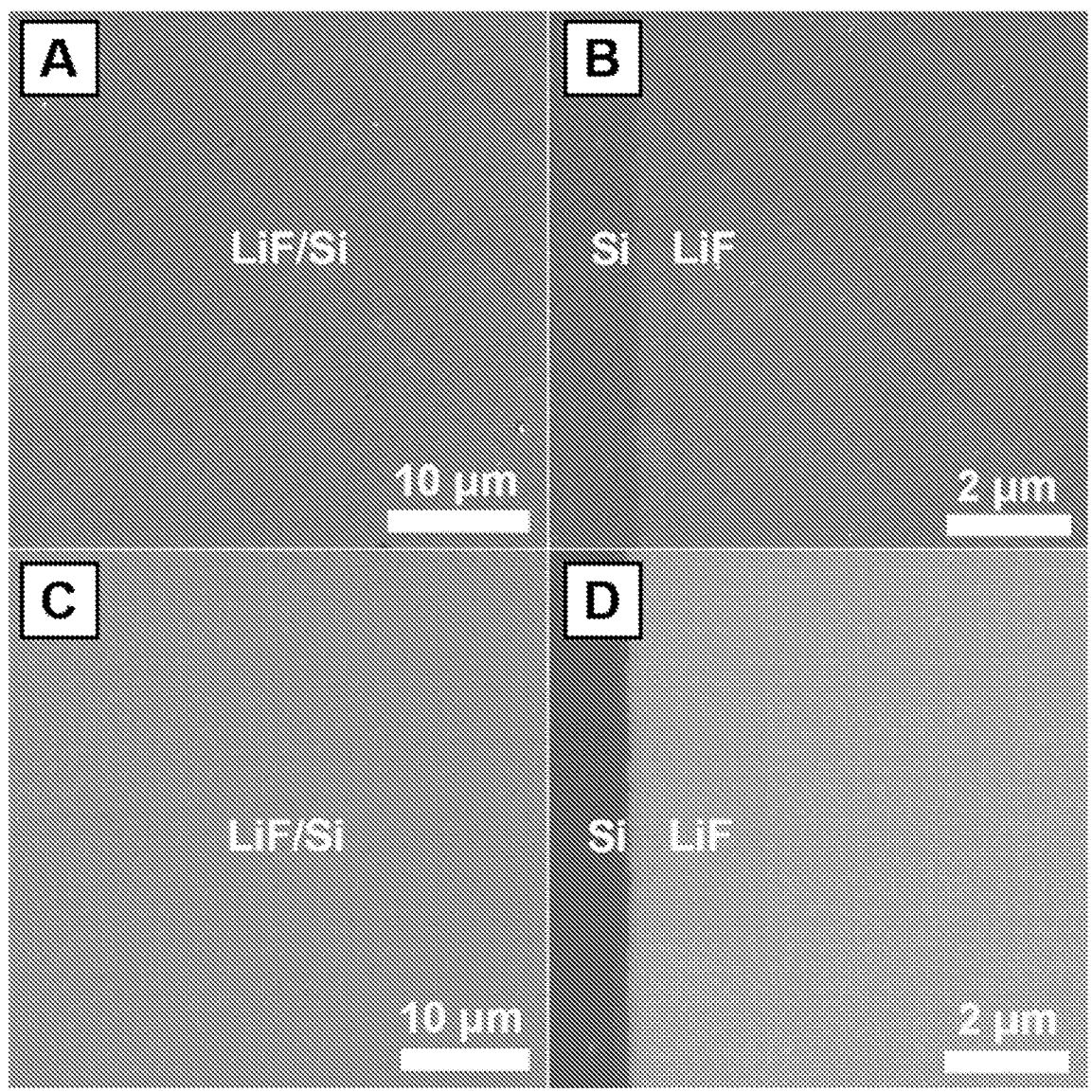
FIG. 8. SEM characterization of ALD LiF deposition on Si. (a, b) 50 ALD cycles of LiF deposition on Si; and (c, d) 250 ALD cycles of LiF deposition on Si.

ALD of LiF was carried out using lithium tert-butoxide and titanium fluoride (TiF$_4$) as precursors at a growth temperature of about 250° C. ALD can achieve a conformal coating. For instance, the ALD LiF film developed was highly uniform on the pristine Si substrate (FIGS. 8a and 8b) with just 50 ALD cycles. In FIG. 8b, the left-hand side of the Si wafer was protected by a high temperature resistant tape. After 50 ALD cycles of LiF deposition, the tape was removed to show the contrast between LiF deposition and no LiF deposition. SEM characterizations of 250 ALD cycles LiF deposition on Si were also given in FIGS. 8c and 8d.

Figure 9A:
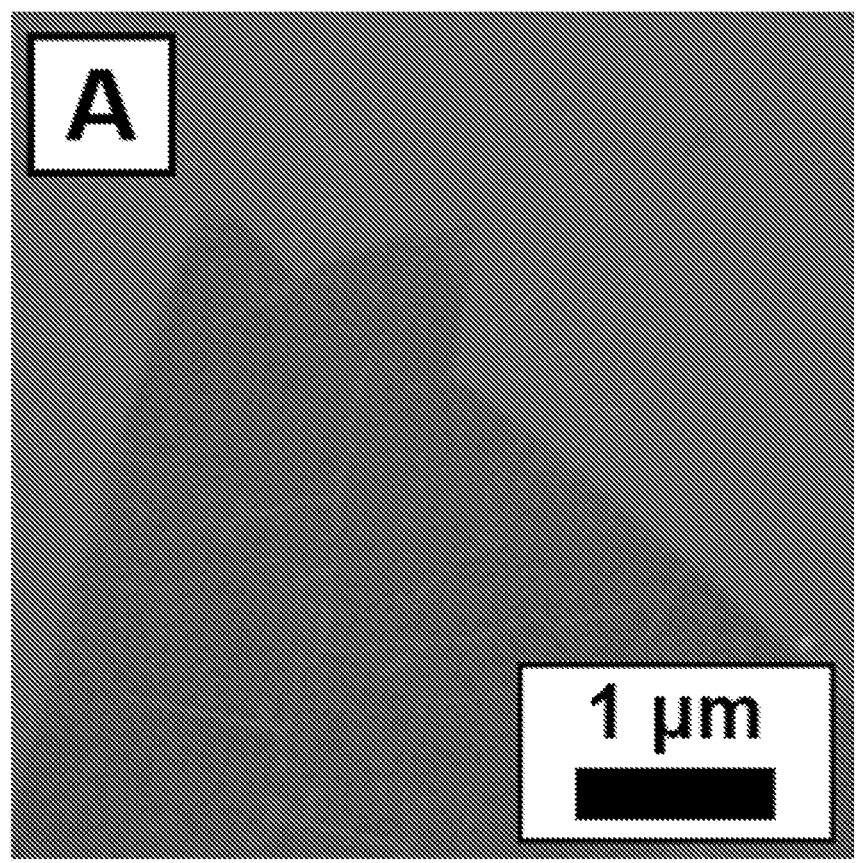
FIG. 9. SEM characterization of ALD LiF deposition on h-BN. (a) 25 ALD cycles of LiF deposition on h-BN; (b) 50 ALD cycles of LiF deposition on h-BN; and (c) 150 ALD cycles of LiF deposition on h-BN.
Figure 9B:
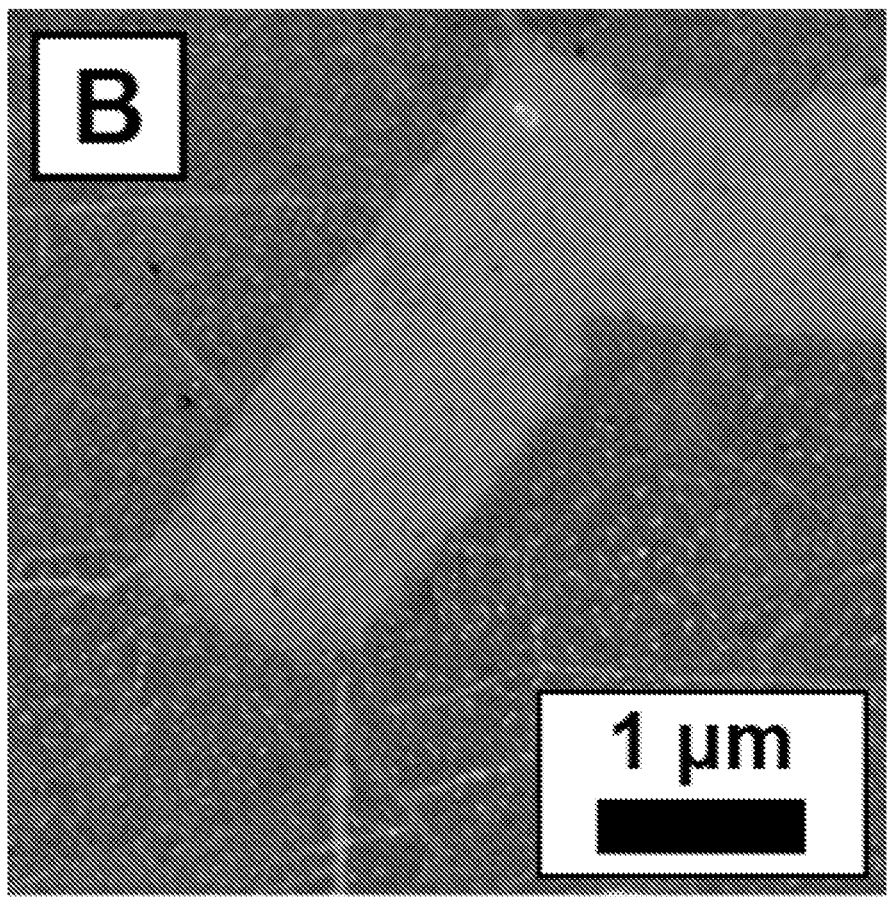
Figure 9C:
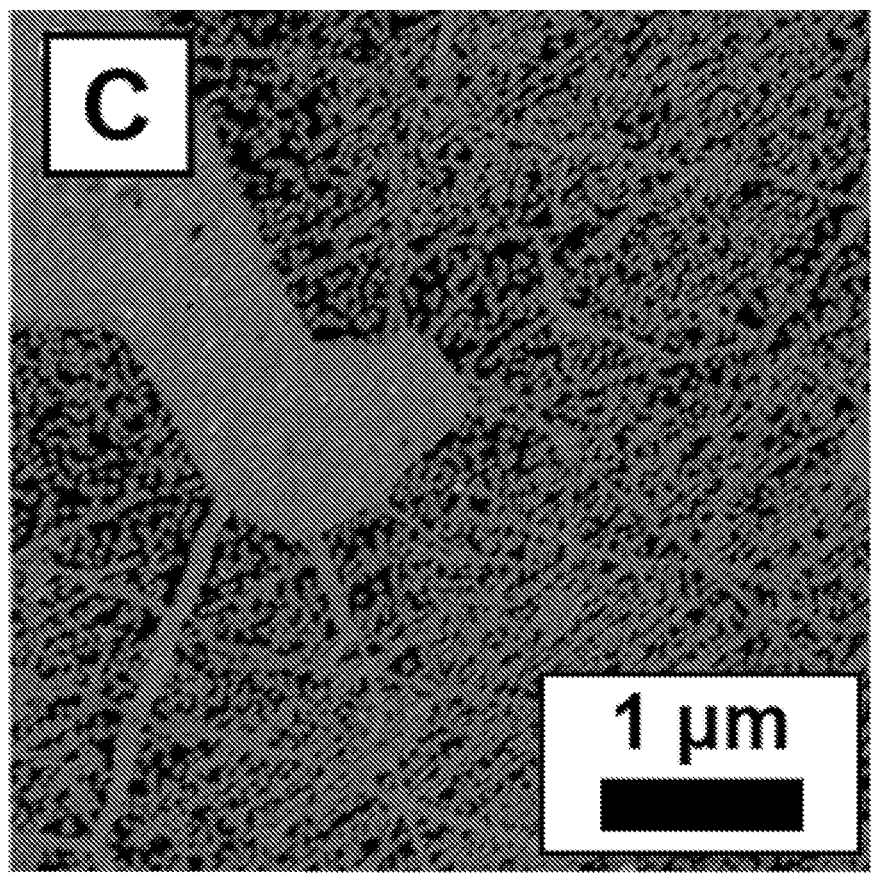

The amount of LiF deposition can be controlled by varying ALD cycle numbers. FIG. 9 shows 25 ALD cycles, 50 ALD cycles and 150 ALD cycles of LiF deposition on h-BN. While all samples show selective LiF deposition, the diameters of LiF nanowires and the sizes of LiF nanoparticles increased with increasing ALD cycle numbers.

Figure 10A:
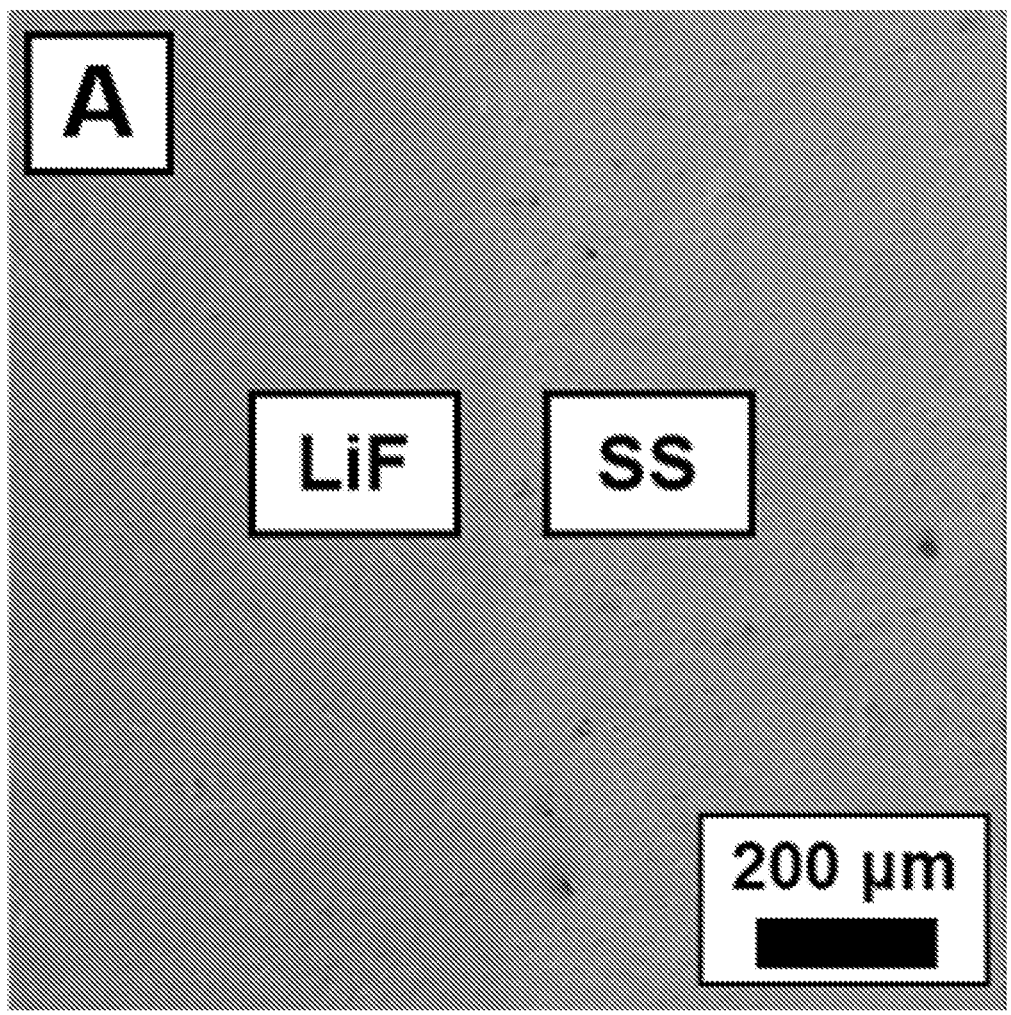
FIG. 10. SEM characterization of 50 ALD cycles of LiF deposition on a stainless steel (SS) spacer (a) and a piece of Cu current collector (b).
Figure 10B:
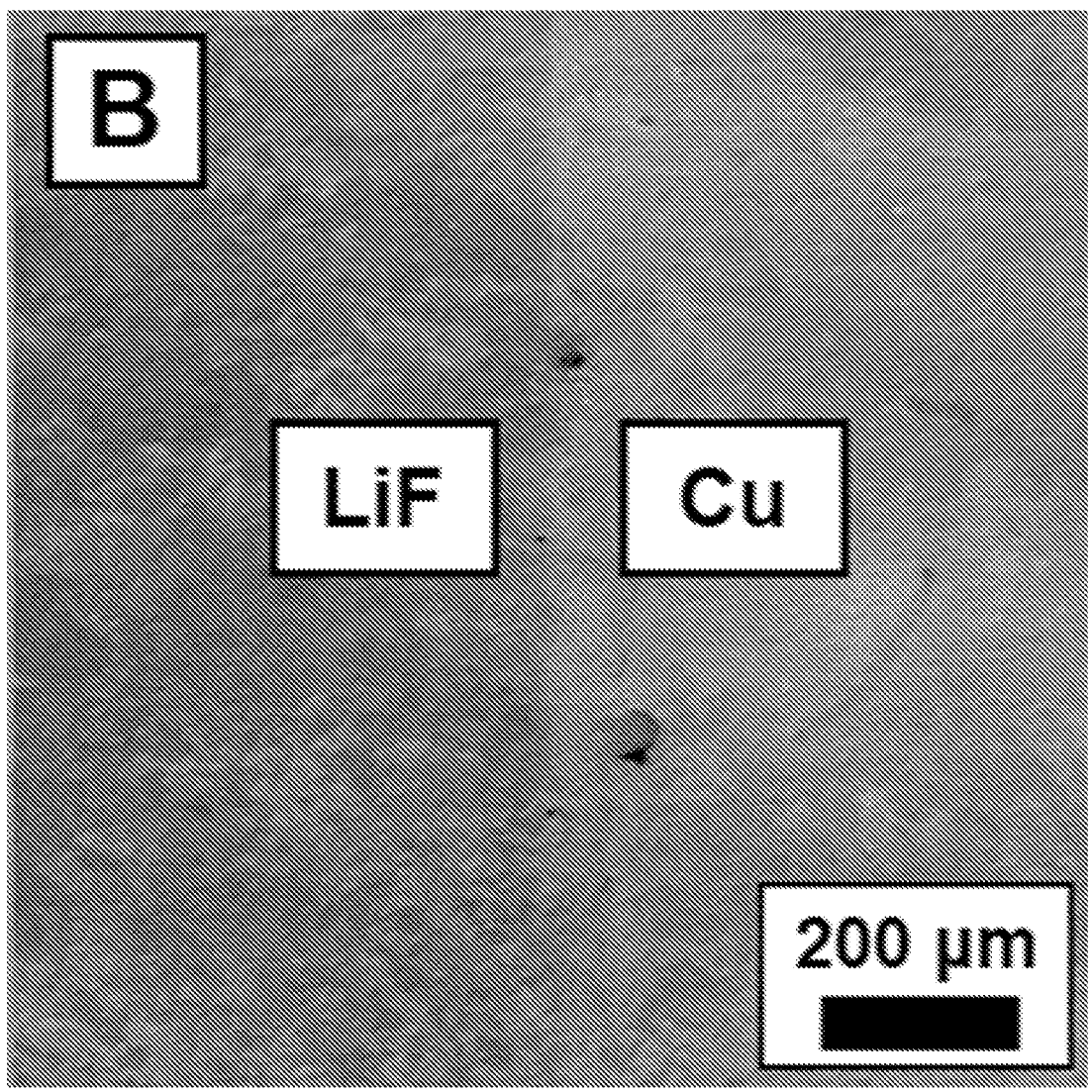

50 ALD cycles of LiF deposition were performed on both SS and Cu substrates with high uniformity across large areas. As shown in FIG. 10, the right-hand sides of both substrates were protected by high temperature resistant tapes during deposition as a control to reveal pristine surfaces of SS and Cu (a few tape residues were left on the right-hand sides after the removal of the tapes). Similar to ALD LiF deposition on the Si substrate, the left-hand side of SS was uniformly coated. The coverage of ALD LiF deposition on Cu was also uniform (the difference in contrast within the left-hand side was due to the orientation of different Cu grains).

Figure 11:
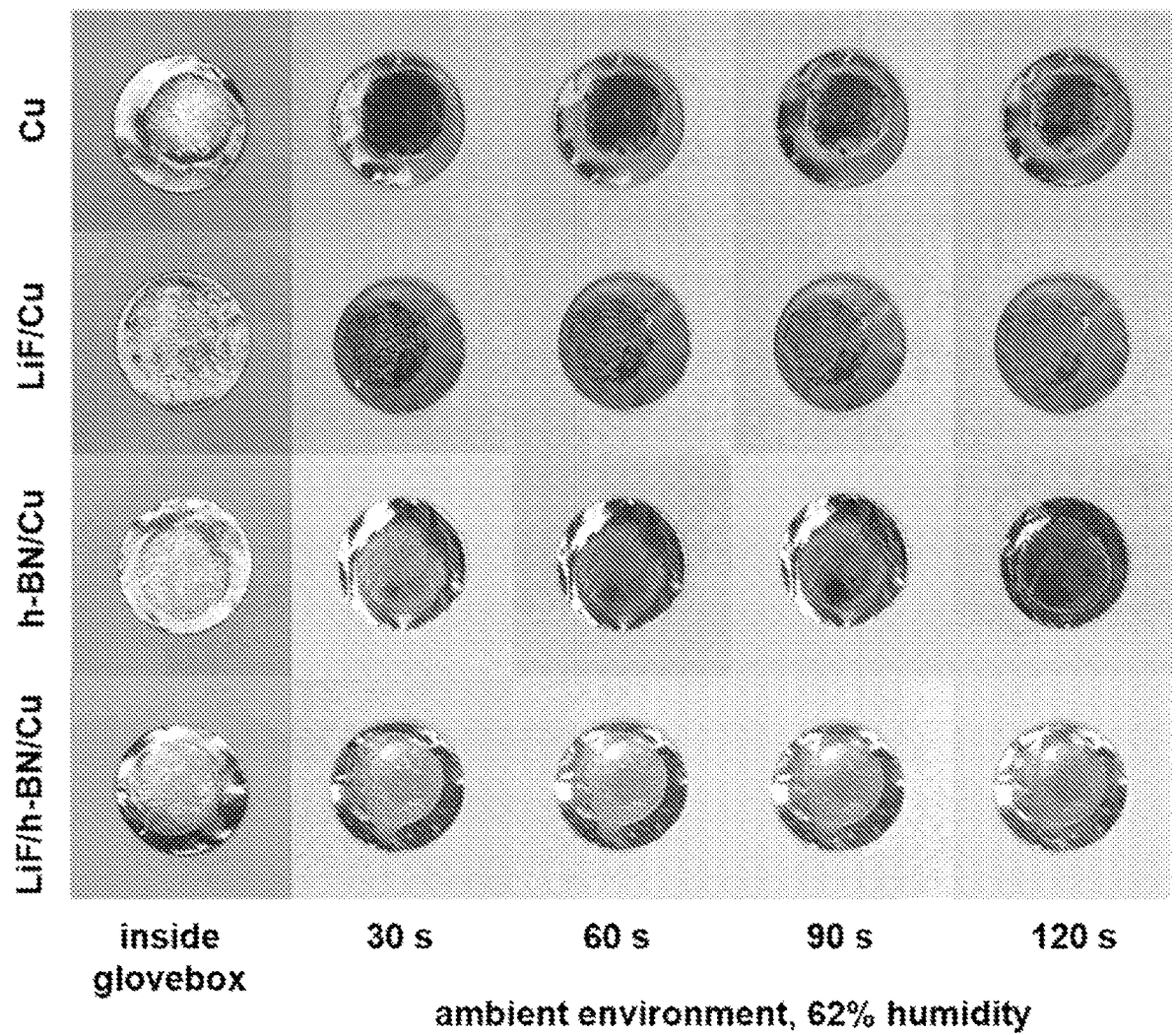
FIG. 11. Optical images of Cu, LiF/Cu, h-BN/Cu and LiF/h-BN/Cu electrodes with electrochemically plated Li inside a glove box (left column) and in an ambient environment with about 62% humidity for different periods of times (right four columns: 30 s, 60 s, 90 s and 120 s).

Li metal is highly reactive and changes color when it reacts with $H_2O$, $CO_2$ and $N_2$ in the ambient air. A perfect LiF/h-BN film coverage could in-principle prevent Li from reacting with air, and therefore keep Li metal's original metallic color. As shown in FIG. 11, all Li plated electrodes extracted from coin cells inside a glove box have a shiny metallic color. The difference is that the Li plated on LiF/Cu electrode was not as uniform as Li plated on Cu, h-BN/Cu and LiF/h-BN/Cu. Electrodes were then taken out of the glove box and optical images were recorded at different times in an ambient environment (about 62% humidity at the time of measurement). The color of Li plated Cu electrode quickly changed from metallic color to black within about 30 s. Similarly, the color of Li plated LiF/Cu electrode turned to black within about 30 s. The result indicates that the native SEI is not effective in stopping Li degradation in the ambient environment. On the contrary, the color change was much slower for Li plated h-BN/Cu electrode, which turned to black in about 120 s. The Li plated LiF/h-BN/Cu electrode was most resistant to ambient air attack, and its color change was least noticeable within about 120 s. Such exceptional stability was attributed to the intact LiF/h-BN layer with Li plated underneath.

As used herein, the singular terms "a," "an," and "the" may include plural referents unless the context clearly dictates otherwise. Thus, for example, reference to an object may include multiple objects unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the term "size" refers to a characteristic dimension of an object. Thus, for example, a size of an object that is circular or spherical can refer to a diameter of the object. In the case of an object that is non-circular or non-spherical, a size of the object can refer to a diameter of a corresponding circular or spherical object, where the corresponding circular or spherical object exhibits or has a particular set of derivable or measurable characteristics that are substantially the same as those of the non-circular or non-spherical object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

As used herein, an "alkali metal" refers to an element from Group 1 of the Periodic Table, encompassing lithium (Li), sodium (Na), potassium (K), rubidium (Rb), cesium (Cs), and francium (Fr).

As used herein, a "post-transition metal" refers to an element from a set encompassing aluminum (Al), gallium (Ga), indium (In), tin (Sn), thallium (Tl), lead (Pb), bismuth (Bi), and polonium (Po).

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While this disclosure has been described with reference to the specific embodiments thereof, it should be understood by those skilled in the art that various changes may be made and equivalents may be substituted without departing from the true spirit and scope of this disclosure as defined by the appended claims. In addition, many modifications may be made to adapt a particular situation, material, composition of matter, method, operation or operations, to the objective, spirit and scope of this disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of this disclosure. Accordingly, unless specifically indicated herein, the order and grouping of the operations are not a limitation of this disclosure.

What is claimed is:

1. An anode comprising:
a current collector; and
an interfacial layer disposed over the current collector,
wherein the interfacial layer includes a film of a layered material including defect sites and an artificial SEI enriched with LiF and selectively disposed over the defect sites of the film, while other regions of the film remain exposed from the artificial SEI.

2. The anode of claim 1, wherein the layered material includes hexagonal boron nitride, graphene, a layered transition metal oxide, or a layered transition metal chalcogenide.

3. The anode of claim 1, wherein the film is polycrystalline.

4. The anode of claim 1, wherein the reinforcing material is disposed as nanostructures over the film.

5. The anode of claim 1, wherein the reinforcing material is disposed as discrete coating regions that are spaced apart from one another over the film.

6. The anode of claim 1, further comprising an anode material disposed between the current collector and the interfacial layer.

7. The anode of claim 6, wherein the anode material is lithium metal.

8. A battery comprising:
the anode of claim 1;
a cathode; and
an electrolyte disposed between the anode and the cathode.

9. A method of forming an anode for a battery, comprising:
providing a current collector and a film of a layered material including defect sites disposed over the current collector; and
performing atomic layer deposition to deposit an artificial SEI enriched with LiF selectively on the defect sites of the film, while other regions of the film remain exposed from the artificial SEI.

10. The anode of claim 1, wherein the artificial SEI consists of lithium fluoride.

11. The method of claim 9, wherein providing the current collector and the film includes forming the film, via chemical vapor deposition, over a substrate, and transferring the film from the substrate to the current collector.

12. The method of claim 9, wherein the layered material includes hexagonal boron nitride, graphene, a layered transition metal oxide, or a layered transition metal chalcogenide.

13. The method of claim 9, wherein performing atomic layer deposition includes sequentially performing a first atomic layer deposition cycle to introduce a chemical precursor including lithium, followed by performing a second atomic layer deposition cycle to introduce a chemical precursor including fluorine.

14. The method of claim 9, wherein the reinforcing material provides a surface coverage of the film of up to 60%.

15. The method of claim 9, wherein the artificial SEI consists of lithium fluoride.

* * * * *